(12) United States Patent
Higuchi et al.

(10) Patent No.: US 11,791,770 B2
(45) Date of Patent: Oct. 17, 2023

(54) CIRCUIT DEVICE AND OSCILLATOR

(71) Applicant: SEIKO EPSON CORPORATION, Tokyo (JP)

(72) Inventors: Teppei Higuchi, Chino (JP); Jun Uehara, Fujimi-machi (JP); Yuichi Toriumi, Minowa-machi (JP); Hiroshi Kiya, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/863,714

(22) Filed: Jul. 13, 2022

(65) Prior Publication Data
US 2023/0020823 A1 Jan. 19, 2023

(30) Foreign Application Priority Data
Jul. 15, 2021 (JP) .................. 2021-116865

(51) Int. Cl.
*H03B 5/04* (2006.01)
*H03B 5/36* (2006.01)

(52) U.S. Cl.
CPC ............. *H03B 5/04* (2013.01); *H03B 5/36* (2013.01)

(58) Field of Classification Search
CPC ..................................................... H03B 5/04
USPC .................................................... 331/66
See application file for complete search history.

(56) References Cited

U.S. PATENT DOCUMENTS

2019/0238139 A1\* 8/2019 Haneda .............. G06N 3/04

FOREIGN PATENT DOCUMENTS

JP 2001-102870 A 4/2001

\* cited by examiner

*Primary Examiner* — Joseph Chang
(74) *Attorney, Agent, or Firm* — Rankin, Hill & Clark LLP

(57) ABSTRACT

A circuit device includes a first terminal, a first oscillation circuit oscillating a resonator and generating a first voltage for automatic gain control for controlling amplitude of a signal output from the resonator, a digital signal generation circuit generating a digital signal corresponding to the first voltage, and a first interface circuit outputting the digital signal to the first terminal.

9 Claims, 9 Drawing Sheets

CIRCUIT DEVICE AND OSCILLATOR

The present application is based on, and claims priority from JP Application Serial Number 2021-116865, filed Jul. 15, 2021, the disclosure of which is hereby incorporated by reference herein in its entirety.

BACKGROUND

1. Technical Field

The present disclosure relates to a circuit device and an oscillator.

2. Related Art

JP-A-2001-102870 discloses a quartz crystal oscillator including a quartz crystal resonator, an LSI oscillating the quartz crystal resonator, and a testing terminal electrically coupled to a terminal of the quartz crystal resonator in testing of the quartz crystal resonator. According to the quartz crystal oscillator described in JP-A-2001-102870, for example, a CI value of the resonator may be tested after assembly of the quartz crystal oscillator.

In the quartz crystal oscillator described in JP-A-2001-102870, a dedicated terminal for testing to be coupled to the electrode of the quartz crystal resonator is necessary in addition to an external terminal electrically coupled to an external device in an oscillating operation state. However, when the package of the quartz crystal oscillator is downsized, it is hard to provide the dedicated terminal and testing of the CI value may be difficult.

SUMMARY

An aspect of a circuit device according to the present disclosure includes a first terminal, a first oscillation circuit oscillating a resonator and generating a first voltage for automatic gain control for controlling amplitude of a signal output from the resonator, a digital signal generation circuit generating a digital signal corresponding to the first voltage, and a first interface circuit outputting the digital signal to the first terminal.

An aspect of an oscillator according to the present disclosure includes a resonator, and a circuit device electrically coupled to the resonator, wherein the circuit device includes a first terminal, a first oscillation circuit oscillating the resonator and generating a first voltage for automatic gain control for controlling amplitude of a signal output from the resonator, a digital signal generation circuit generating a digital signal corresponding to the first voltage, and a first interface circuit outputting the digital signal to the first terminal.

DESCRIPTION OF EXEMPLARY EMBODIMENTS

As below, preferred embodiments of the present disclosure will be explained in detail using the drawings. Note that the embodiments to be described do not unduly limit the present disclosure described in the appended claims. Further, not all the configurations to be described are essential configuration elements of the present disclosure.

1. First Embodiment

1-1. Configuration of Oscillator

Figure 1:
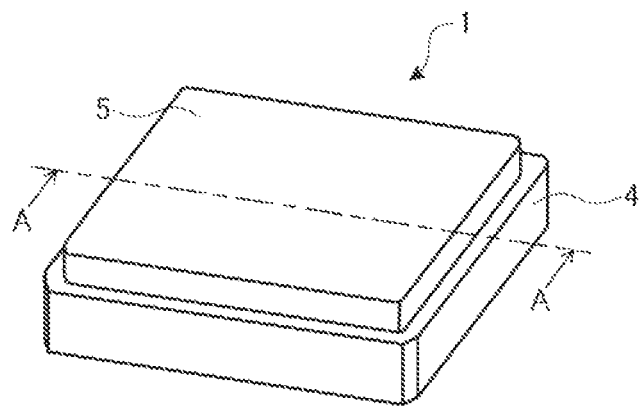
FIG. 1 is a perspective view of an oscillator of an embodiment.
Figure 2:
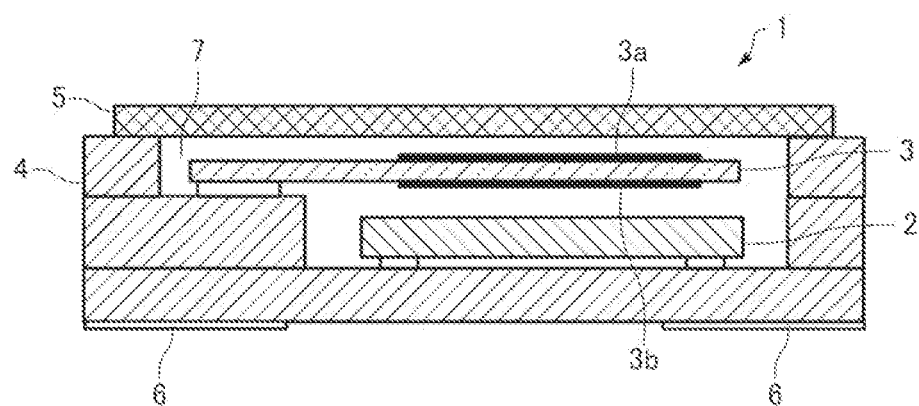
FIG. 2 is a sectional view of the oscillator of the embodiment.
Figure 3:
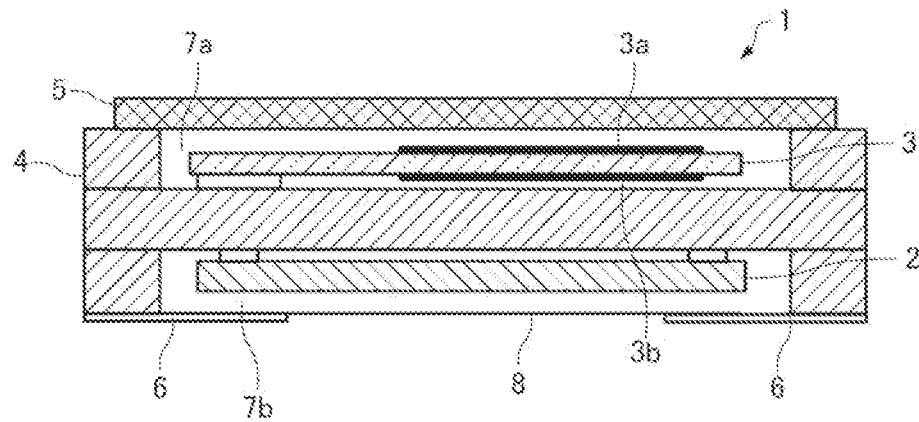
FIG. 3 is another sectional view of the oscillator of the embodiment.
Figure 4:
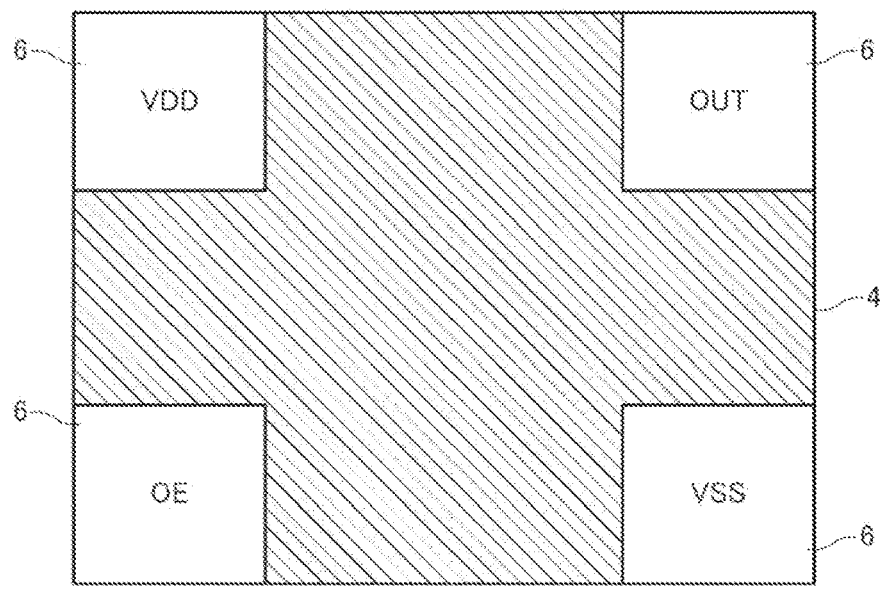
FIG. 4 is a bottom view of the oscillator of the embodiment.

FIGS. 1 to 4 show an example of a structure of an oscillator 1 of an embodiment. FIG. 1 is a perspective view of the oscillator 1, and FIG. 2 is an example of a sectional view along A-A in FIG. 1. FIG. 3 is another example of the sectional view along A-A in FIG. 1 and FIG. 4 is a bottom view of the oscillator 1.

As shown in FIGS. 1 to 3, the oscillator 1 includes a circuit device 2, a resonator 3, a package 4, a lid 5, and a plurality of external terminals 6. In the embodiment, the resonator 3 is a quartz crystal resonator using quartz crystal as a substrate material e.g. an AT cut quartz crystal resonator, a tuning fork type quartz crystal resonator, or the like. The resonator 3 may be an SAW resonator or an MEMS resonator. SAW is an abbreviation for Surface Acoustic Wave and MEMS is an abbreviation for Micro Electro Mechanical Systems. Or, as the substrate material of the resonator 3, not only the quartz crystal but also a piezoelectric single crystal such as lithium tantalate or lithium niobate, a piezoelectric material of piezoelectric ceramics such as lead zirconate titanate, or a silicon semiconductor material may be used. As exciting means for the resonator 3, a piezoelectric effect may be used or electrostatic drive by Coulomb's force may be used. Further, in the embodiment, the circuit device 2 is realized by a one-chip integrated circuit. Note that the circuit device 2 may be formed at least partially by a discrete component.

The oscillator 1 shown in FIG. 2 is an oscillator having a single-sealed structure, and the package 4 houses the circuit device 2 and the resonator 3 within the same space. Specifically, a concave portion is provided in the package 4 and the concave portion is covered by the lid 5 to form a housing chamber 7. Further, the oscillator 1 shown in FIG. 3 is an oscillator having an H-shaped structure, two concave portions are provided on opposing surfaces in the package 4, one concave portion is covered by the lid 5 to form a housing chamber 7a and the other concave portion is covered by a sealing member 8 to form a housing chamber 7b. The resonator 3 is housed in the housing chamber 7a and the circuit device 2 is housed in the housing chamber 7b.

The resonator 3 has metal excitation electrodes 3a, 3b on a front surface and a back surface thereof, respectively, and oscillates at a desired frequency according to the shape and the mass of the resonator 3 including the excitation electrodes 3a, 3b. On surfaces inside or of the concave portions of the package 4, wires (not shown) for electrically coupling two terminals of the circuit device 2, specifically, a T5 terminal and a T6 terminal in FIG. 5, which will be described later, and the two excitation electrodes 3a, 3b of the resonator 3, respectively, are provided. Further, on surfaces inside or of the concave portions of the package 4, wires (not shown) for electrically coupling the respective terminals of the circuit device 2 and the respective external terminals 6 provided on the bottom surface of the package 4 are provided.

As shown in FIG. 4, the oscillator 1 of the embodiment has the four external terminals 6 of a VDD terminal as a power supply terminal to which a power supply voltage VDD is supplied, a VSS terminal as a ground terminal to which a ground voltage VSS is supplied, an OUT terminal as an output terminal, and an OE terminal as an output enable terminal provided on the back surface of the package 4 as the bottom surface. That is, in the embodiment, the package 4 has the four external terminals 6 of the VDD terminal, the VSS terminal, the OUT terminal, and the OE terminal.

Figure 5:
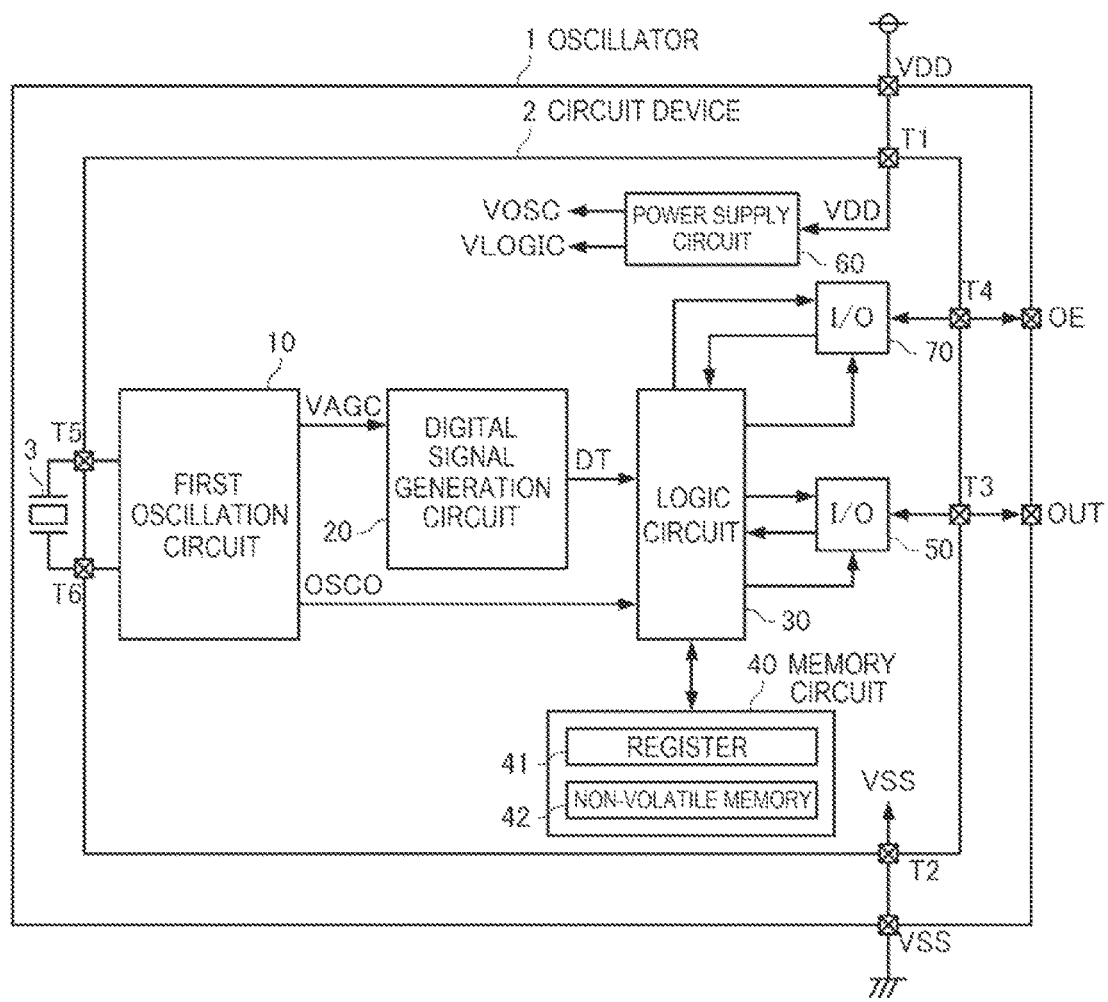
FIG. 5 is a functional block diagram of the oscillator of a first embodiment.

FIG. 5 is a functional block diagram of the oscillator 1 of a first embodiment. As shown in FIG. 5, the oscillator 1 of the embodiment includes the circuit device 2 and the resonator 3. The circuit device 2 has a T1 terminal, a T2 terminal, a T3 terminal, a T4 terminal, the T5 terminal, and the T6 terminal as external coupling terminals. The T1 terminal, the T2 terminal, the T3 terminal, and the T4 terminal are electrically coupled to the VDD terminal, the VSS terminal, the OUT terminal, and the OE terminal as the plurality of external terminals 6 of the oscillator 1 shown in FIG. 4, respectively. The T5 terminal is electrically coupled to one end of the resonator 3 and the T6 terminal is electrically coupled to the other end of the resonator 3.

In the embodiment, the circuit device 2 includes a first oscillation circuit 10, a digital signal generation circuit 20, a logic circuit 30, a memory circuit 40, an interface circuit 50, a power supply circuit 60, and an interface circuit 70. Note that the circuit device 2 may have a configuration in which part of these elements are omitted or changed or another element is added.

The power supply circuit 60 generates a voltage VOSC and a voltage VLOGIC as fixed voltages based on the power supply voltage VDD externally supplied via the VDD terminal and the T1 terminal, respectively. The power supply voltage VDD is supplied to the first oscillation circuit 10 and the digital signal generation circuit 20. The voltage VOSC is supplied to the first oscillation circuit 10. The voltage VLOGIC is supplied to the digital signal generation circuit 20, the logic circuit 30, the memory circuit 40, the interface circuit 50, and the interface circuit 70. For example, the power supply circuit 60 may include a regulator generating a fixed voltage based on an output voltage of a bandgap reference circuit.

The first oscillation circuit 10 is electrically coupled to the T5 terminal and the T6 terminal, oscillates the resonator 3, and generates an oscillation signal OSCO. Specifically, the signal output from the resonator 3 is input to the first oscillation circuit 10 via the T5 terminal, and the circuit amplifies and supplies the signal to the resonator 3 via the T6 terminal. Further, the first oscillation circuit 10 generates a voltage VAGC for automatic gain control for controlling the amplitude of the signal output from the resonator 3. The magnitude of the voltage VAGC changes to keep the amplitude of the signal output from the resonator 3 and input to the T5 terminal constant. Specifically, the resonator 3 is harder to oscillate as the CI value is higher, and, in order to keep the amplitude of the signal input from the resonator 3 via the T5 terminal constant, the first oscillation circuit 10 sets the voltage VAGC to be higher and sets a DC voltage of the signal supplied to the resonator 3 via the T6 terminal to be higher as the CI value of the resonator 3 is higher. As described above, the voltage VAGC correlates with the CI value of the resonator 3.

The digital signal generation circuit 20 generates a digital signal DT corresponding to the voltage VAGC. The voltage VAGC correlates with the CI value of the resonator 3, and accordingly, the value of the digital signal DT also correlates with the CI value. For example, the digital signal generation circuit 20 may generate the digital signal DT having a larger value as the voltage VAGC is higher, that is, the CI value is higher and generate the digital signal DT having a smaller value as the voltage VAGC is lower, that is, the CI value is lower.

The memory circuit 40 is a circuit storing various kinds of information and has a register 41 and a non-volatile memory 42. The non-volatile memory 42 is e.g. a MONOS-type memory, an EEPROM, or the like. MONOS is an abbreviation for Metal Oxide Nitride Oxide Silicon and EEPROM is an abbreviation for Electrically Erasable Programmable Read-Only Memory. In the manufacturing process of the oscillator 1, various kinds of information for controlling the respective circuits is stored in the non-volatile memory 42. When the oscillator 1 is powered on, the various kinds of information stored in the non-volatile memory 42 is transferred to the register 41 and the various kinds of information stored in the register 41 is appropriately supplied to the respective circuits.

The logic circuit 30 controls operations of the respective circuits. Specifically, based on the control signal input to the terminal of the circuit device 2, the logic circuit 30 sets an operation mode of the oscillator 1 or the circuit device 2 to one of a plurality of modes including an external communication mode, a normal operation mode, and various test modes and performs control according to the set operation mode. In the embodiment, when a control signal in a predetermined pattern is input from the OE terminal within a predetermined period from the start of the supply of the power supply voltage VDD to the VDD terminal, the logic circuit 30 sets the operation mode to the external communication mode after a lapse of the predetermined period. For example, the logic circuit 30 may use a period after the resonator 3 starts oscillation by the supply of the power supply voltage VDD and before the stabilized oscillation is detected as the predetermined period, or may count the pulse number of the oscillation signal OSCO and determine the lapse of the predetermined period when the count value reaches a predetermined value. Or, for example, the logic circuit 30 may measure the predetermined period based on an output signal of an RC time constant circuit that starts operation by the supply of the power supply voltage VDD.

In the external communication mode, the logic circuit 30 may perform data communications with an external device (not shown) via the OE terminal and the OUT terminal. The external device outputs a serial clock signal to the OUT terminal, outputs a serial data signal to the OE terminal or acquire a signal output from the logic circuit 30 to the OE terminal in synchronization with the serial clock signal according to a predetermined communication standard. In the external communication mode, the logic circuit 30 controls the interface circuit 50 to output the serial clock signal input from the T3 terminal to the logic circuit 30, and controls the interface circuit 70 to output the serial data signal input from the T4 terminal to the logic circuit 30 or output a signal output from the logic circuit 30 as a serial data signal to the T4 terminal according to a predetermined communication standard. In the external communication mode, the logic circuit 30 samples the serial data signals as various commands with respect to each edge of the serial clock signal compliant to e.g. a standard for I2C bus. I2C is an abbreviation for Inter-Integrated Circuit. Then, the logic circuit 30 performs setting of the operation mode and processing of reading and writing data from and in the register 41 and the non-volatile memory 42 based on the sampled commands. Note that, in the embodiment, for example, the logic circuit 30 communicates with an external device at a communication standard for two-wire bus such as an I2C bus, however, may communicates with an external device at a communication standard for three-wire bus or four-wire bus such as an SPI bus. SPI is an abbreviation for Serial Peripheral Interface.

For example, when sampling a normal operation mode setting command in the external communication mode, the logic circuit 30 changes the operation mode from the external communication mode to the normal operation mode. In the normal operation mode, the logic circuit 30 controls the interface circuit 50 to output the oscillation signal OSCO output from the logic circuit 30 to the T3 terminal and controls the interface circuit 70 to output the signal input from the T4 terminal to the logic circuit 30. Specifically, in the normal operation mode, the logic circuit 30 outputs the oscillation signal OSCO to the T3 terminal via the interface circuit 50 when the T4 terminal is at the high level, and does not output the oscillation signal OSCO to the T3 terminal via the interface circuit 50, but outputs the ground voltage VSS when the T4 terminal is at the low level. Thereby, in the normal operation mode, when the OE terminal is at the high level, the oscillation signal OSCO based on the signal output from the resonator 3 is output from the OUT terminal and, when the OE terminal is at the low level, the ground voltage VSS is output from the OUT terminal. That is, in the normal operation mode, the output of the oscillation signal OSCO from the OUT terminal is controlled based on the signal input to the OE terminal.

Note that, when the control signal in the predetermined pattern is not input from the OE terminal within the predetermined period from the start of the supply of the power supply voltage VDD, the logic circuit 30 sets the operation mode directly to the normal operation mode, not to the external communication mode after the lapse of the predetermined period.

Further, for example, in the external communication mode, when sampling a CI value test command, the logic circuit 30 changes the operation mode from the external communication mode to a CI value test mode as one of the test modes. In the CI value test mode, the logic circuit 30 operates the digital signal generation circuit 20, acquires a digital signal DT having a value corresponding to the CI value of the resonator 3 output from the digital signal generation circuit 20 at a predetermined time, and stores the signal in the register 41. Then, when changing the operation mode from the CI value test mode to the external communication mode and sampling a command to read out the digital signal DT transmitted from the external device, the logic circuit 30 reads out the digital signal DT from the register 41 and outputs the signal to the interface circuit 70. The interface circuit 70 outputs the digital signal DT to the T4 terminal, and thereby, the digital signal DT is output from the OE terminal.

Note that, in the normal operation mode, the logic circuit 30 stops the operation of the digital signal generation circuit 20 to reduce power consumption.

1-2. Configuration of Oscillation Circuit

Figure 6:
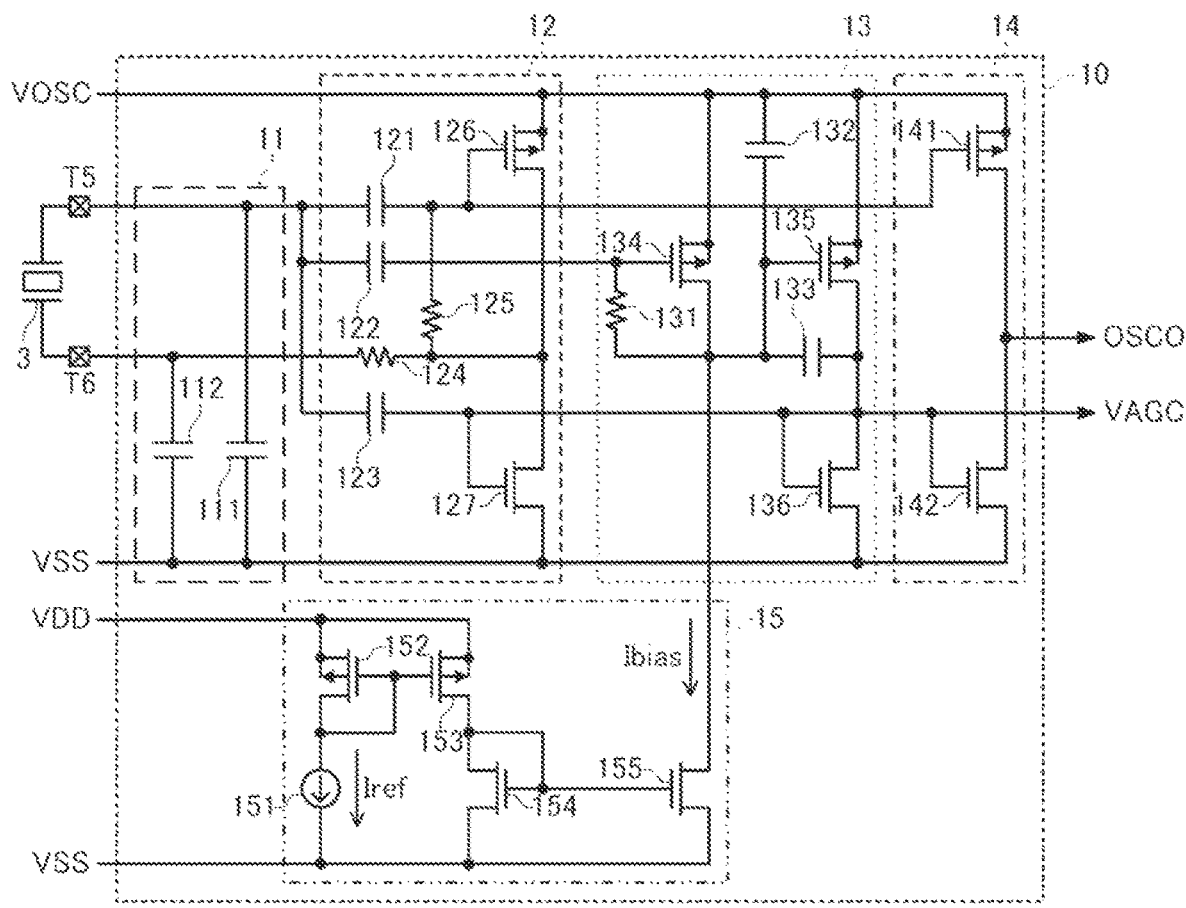
FIG. 6 shows a configuration example of a first oscillation circuit.

FIG. 6 shows a configuration example of the first oscillation circuit 10. As shown in FIG. 6, the first oscillation circuit 10 includes a capacitance circuit 11, an amplification circuit 12, an automatic gain control circuit 13, an output circuit 14, and a bias current generation circuit 15. Note that the first oscillation circuit 10 of the embodiment has a configuration in which part of these elements is omitted or changed or an another element is added.

The bias current generation circuit 15 includes a constant-current source 151, a P-channel type MOS transistors 152, 153, and N-channel type MOS transistors 154, 155. MOS is an abbreviation for Metal Oxide Semiconductor. The constant-current source 151 has one end electrically coupled to the gate of the MOS transistor 152, the drain of the MOS transistor 152, and the gate of the MOS transistor 153 and the other end to which the ground voltage VSS is supplied. The power supply voltage VDD is supplied to the source of the MOS transistor 152 and the source of the MOS transistor 153. The drain of the MOS transistor 153 is electrically coupled to the gate of the MOS transistor 154, the drain of the MOS transistor 154, and the gate of the MOS transistor 155. The ground voltage VSS is supplied to the source of the MOS transistor 154 and the source of the MOS transistor 155. The drain of the MOS transistor 155 is electrically coupled to the drain of a MOS transistor 134 of the automatic gain control circuit 13.

In the bias current generation circuit 15 having the above described configuration, a reference current Iref flowing in the constant-current source 151 is multiplied by a predetermined number by a current mirror circuit including the MOS transistors 152, 153 and a current mirror circuit including the MOS transistors 154, 155 and flows between the source and the drain of the MOS transistor 155. The current serves as a bias current Ibias of the automatic gain control circuit 13.

The capacitance circuit 11 includes capacitive elements 111, 112. The capacitive element 111 has one end electrically coupled to the T5 terminal and the other end to which the ground voltage VSS is supplied. The capacitive element 112 has one end electrically coupled to the T6 terminal and the other end to which the ground voltage VSS is supplied. The capacitance circuit 11 functions as load capacitance of the resonator 3.

The amplification circuit 12 includes capacitive elements 121, 122, 123, resistive elements 124, 125, a P-channel type MOS transistor 126, and an N-channel type MOS transistor 127. One end of the capacitive element 121, one end of the capacitive element 122, and one end of the capacitive element 123 are electrically coupled to the T5 terminal. The other end of the capacitive element 121 is electrically coupled to one end of the resistive element 125, the gate of the MOS transistor 126, and the gate of a MOS transistor 141 of the output circuit 14. The other end of the capacitive element 122 is electrically coupled to one end of a resistive element 131 and the gate of a MOS transistor 134 of the automatic gain control circuit 13. The other end of the capacitive element 123 is electrically coupled to the gate of the MOS transistor 127, the gate of a MOS transistor 136 of the automatic gain control circuit 13, and the gate of a MOS transistor 142 of the output circuit 14. The resistive element 124 has one end electrically coupled to the T6 terminal and the other end electrically coupled to the other end of the resistive element 125, the drain of the MOS transistor 126, and the drain of the MOS transistor 127. The power supply voltage VDD is supplied to the source of the MOS transistor 126 and the ground voltage VSS is supplied to the source of the MOS transistor 127.

In the amplification circuit 12 having the above described configuration, the signal input from the resonator 3 via the T5 terminal is input to a logic inverting circuit including the MOS transistors 126, 127 via the capacitive elements 121, 123, and the signal inverting-amplified by the logic inverting circuit is supplied to the resonator 3 via the T6 terminal. Thereby, the resonator 3 oscillates.

The automatic gain control circuit 13 includes the resistive element 131, the capacitive elements 132, 133, the P-channel type MOS transistors 134, 135, and the N-channel type MOS transistor 136. The resistive element 131 has one end electrically coupled to the other end of the capacitive element 122 and the gate of the MOS transistor 134 and the other end electrically coupled to one end of the capacitive element 132, one end of the resistive element 133, the drain of the MOS transistor 134, the gate of the MOS transistor 135, and the drain of the MOS transistor 155. The power supply voltage VDD is supplied to the other end of the capacitive element 132, the source of the MOS transistor 134, and the source of the MOS transistor 135. The other end of the resistive element 133 is electrically coupled to the drain of the MOS transistor 135, the gate of the MOS transistor 136, and the drain of the MOS transistor 136. The ground voltage VSS is supplied to the source of the MOS transistor 136.

The automatic gain control circuit 13 having the above described configuration controls the voltage VAGC of the node to which the drain of the MOS transistor 135 and the drain of the MOS transistor 136 are coupled so that the signal input from the resonator 3 via the T5 terminal may have constant amplitude, and the signal according to the voltage VAGC is supplied to the resonator 3 via the T6 terminal. The higher the CI value of the resonator 3, the higher the voltage VAGC and the higher the DC voltage of the signal supplied to the resonator 3 via the T6 terminal. That is, the voltage VAGC is a voltage for automatic gain control.

The output circuit 14 includes the P-channel type MOS transistor 141 and the N-channel type MOS transistor 142. The gate of the MOS transistor 141 is electrically coupled to the other end of the capacitive element 121, one end of the resistive element 125, and the gate of the MOS transistor 126. The power supply voltage VDD is supplied to the source of the MOS transistor 141. The drain of the MOS transistor 141 is electrically coupled to the drain of the MOS transistor 142. The gate of the MOS transistor 142 is electrically coupled to the other end of the capacitive element 123, the gate of the MOS transistor 127, the other end of the capacitive element 133, the drain of the MOS transistor 135, the gate of the MOS transistor 136, and the drain of the MOS transistor 136. The ground voltage VSS is supplied to the source of the MOS transistor 142.

In the output circuit 14 having the above described configuration, the signal input from the resonator 3 via the T5 terminal is input to a logic inverting circuit including the MOS transistors 141, 142 via the capacitive elements 121, 123, and the signal inverting-amplified by the logic inverting circuit is output as the oscillation signal OSCO.

1-3. Configuration of Digital Signal Generation Circuit

Figure 7:
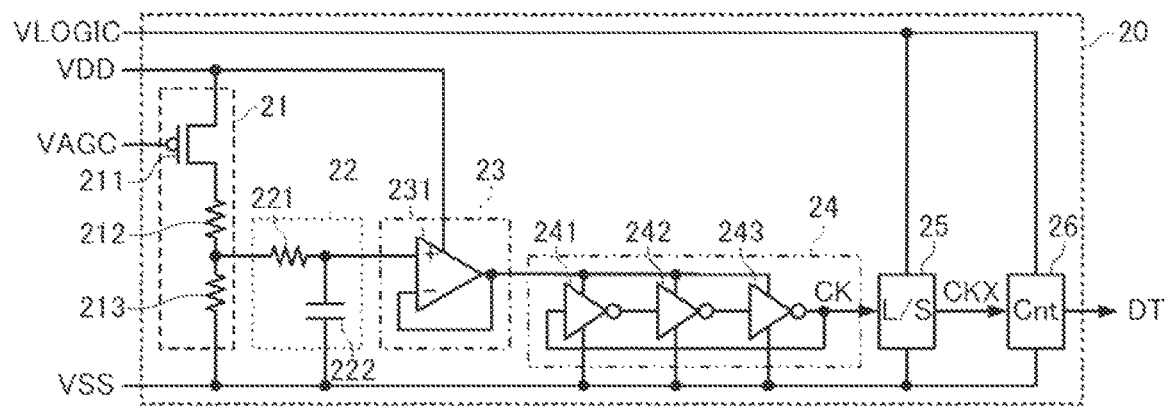
FIG. 7 shows a configuration example of a digital signal generation circuit.

FIG. 7 shows a configuration example of the digital signal generation circuit 20. As shown in FIG. 7, the digital signal generation circuit 20 includes an impedance conversion circuit 21, a filter circuit 22, a voltage buffer circuit 23, a second oscillation circuit 24, a level-shift circuit 25, and a counter 26. Note that the digital signal generation circuit 20 of the embodiment may have a configuration in which part of these elements is omitted or changed or another element is added.

The impedance conversion circuit 21 includes a P-channel type MOS transistor 211 and resistive elements 212, 213. The MOS transistor 211 has the source to which the power supply voltage VDD is supplied, the gate to which the voltage VAGC is input, and the drain electrically coupled to one end of the resistive element 212. The other end of the resistive element 212 is electrically coupled to one end of the resistive element 213 and the ground voltage VSS is supplied to the other end of the resistive element 213. That is, the resistive elements 212, 213 are series-coupled between the drain of the MOS transistor 211 and the ground and forms a divider circuit dividing the voltage of the drain of the MOS transistor 211. The voltage VAGC is input to the impedance conversion circuit 21 having the above described configuration, and the circuit outputs a voltage formed by division of the voltage VAGC at a ratio between a resistance value of the resistive element 212 and a resistance value of the resistive element 213.

The filter circuit 22 includes a resistive element 221 and a capacitive element 222. One end of the resistive element 221 is electrically coupled to the other end of the resistive element 212 and one end of the resistive element 213. The other end of the resistive element 221 is electrically coupled to one end of the capacitive element 222. The ground voltage VSS is supplied to the other end of the capacitive element 222. The filter circuit 22 having the above described configuration is an RC low-pass filter and smooths the output voltage of the impedance conversion circuit 21. The voltage VAGC contains an alternating-current signal component by the oscillation of the resonator 3 and the output voltage of the impedance conversion circuit 21 also contains the alternating-current signal component, however, the alternating-current signal component is reduced by the filter circuit 22.

The voltage buffer circuit 23 includes an operational amplifier 231. The non-inverting input terminal of the operational amplifier 231 is electrically coupled to the other end of the resistive element 221 and one end of the capacitive element 222. The inverting input terminal of the operational amplifier 231 is electrically coupled to the output terminal of the operational amplifier 231. The voltage buffer circuit 23 having the above described configuration is a voltage follower circuit and buffers the output voltage of the filter circuit 22.

The second oscillation circuit 24 includes logic inverting elements 241, 242, 243. The logic inverting element 241 has the input terminal electrically coupled to the output terminal of the logic inverting element 243 and the output terminal electrically coupled to the input terminal of the logic inverting element 242. The output terminal of the logic inverting element 242 is electrically coupled to the input terminal of the logic inverting element 243. The logic inverting elements 241, 242, 243 operate using the output voltage of the voltage buffer circuit 23 as a power supply voltage. The second oscillation circuit 24 having the above described configuration is a ring oscillator in which the logic inverting elements 241, 242, 243 are coupled in a ring shape, and oscillates using the output voltage of the voltage buffer circuit 23 as the power supply voltage. Therefore, the oscillation frequency of the second oscillation circuit 24 is higher as the output voltage of the voltage buffer circuit 23 is higher. Note that the number of logic inverting elements forming the ring oscillator is not limited to three as long as the number is an odd number.

The level-shift circuit 25 shifts an upper limit voltage at the high level of the clock signal CK output from the second oscillation circuit 24 from the power supply voltage VDD to the voltage VLOGIC and outputs a clock signal CKX.

The counter 26 performs count operation based on the clock signal CK as the output signal of the second oscillation circuit 24. Specifically, the clock signal CKX as the signal based on the clock signal CK is input to the counter 26, and the counter 26 counts the pulse number of the clock signal CKX contained in a predetermined time. The predetermined time may be e.g. a time for a predetermined period of the oscillation signal OSCO. The counter value by the counter 26 is output as the digital signal DT from the digital signal generation circuit 20.

Figure 8:
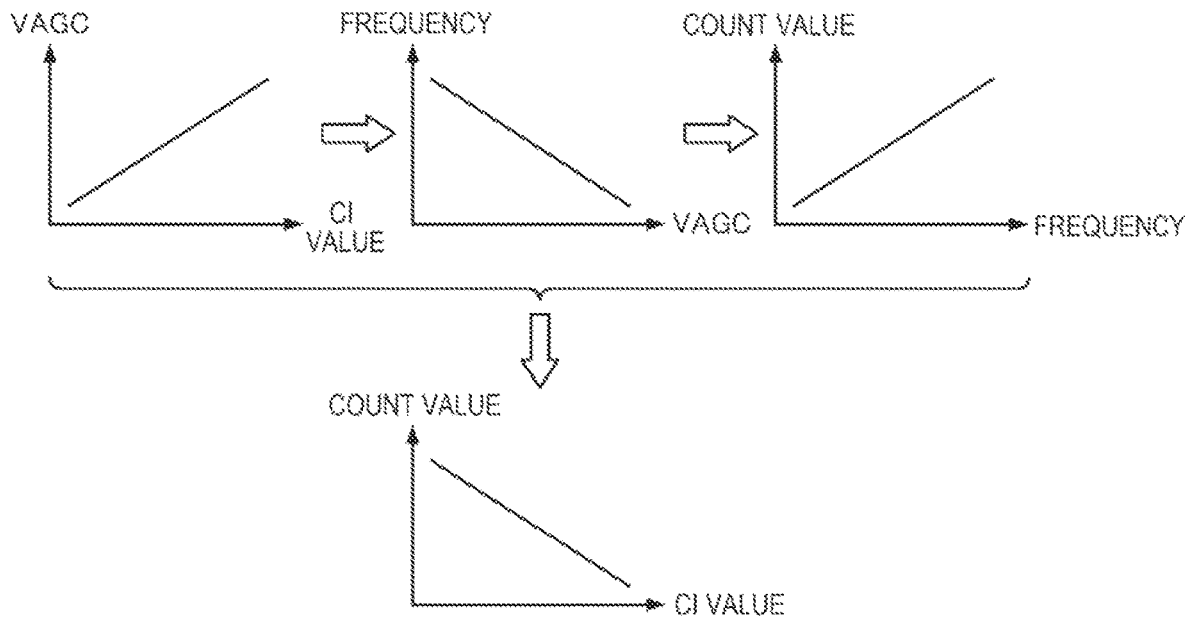
FIG. 8 is a diagram for explanation of a relationship between a CI value of a resonator and a count value.

FIG. 8 is a diagram for explanation of a relationship between the CI value of the resonator 3 and the count value by the counter 26. As shown in FIG. 8, the higher the CI value of the resonator 3, the higher the voltage VAGC. Further, the higher the voltage VAGC, the lower the output voltage of the impedance conversion circuit 21 and the lower the output voltage of the voltage buffer circuit 23, and the lower the frequency of the clock signal CK output from the second oscillation circuit 24. That is, the oscillation frequency of the second oscillation circuit 24 changes according to the voltage VAGC. Further, the lower the frequency of the clock signal CK, the smaller the pulse number of the clock signal CKX contained in the predetermined time, and the smaller the count value by the counter 26. Therefore, when the digital signal generation circuit 20 has the configuration as shown in FIG. 7, the higher the CI value of the resonator 3, the smaller the value of the digital signal DT as the count value by the counter 26.

Note that, in the embodiment, the T4 terminal is an example of a first terminal. The voltage VAGC is an example of a first voltage. The interface circuit 70 is an example of a first interface circuit. The OUT terminal is an example of a first external terminal.

1-4. Testing Method of CI Value

As described above, in the embodiment, in the CI value test mode, the value of the digital signal DT output from the digital signal generation circuit 20 correlates with the CI value of the resonator 3, and a testing device as an external device may test the CI value of the resonator 3 based on the value of the digital signal DT.

Figure 9:
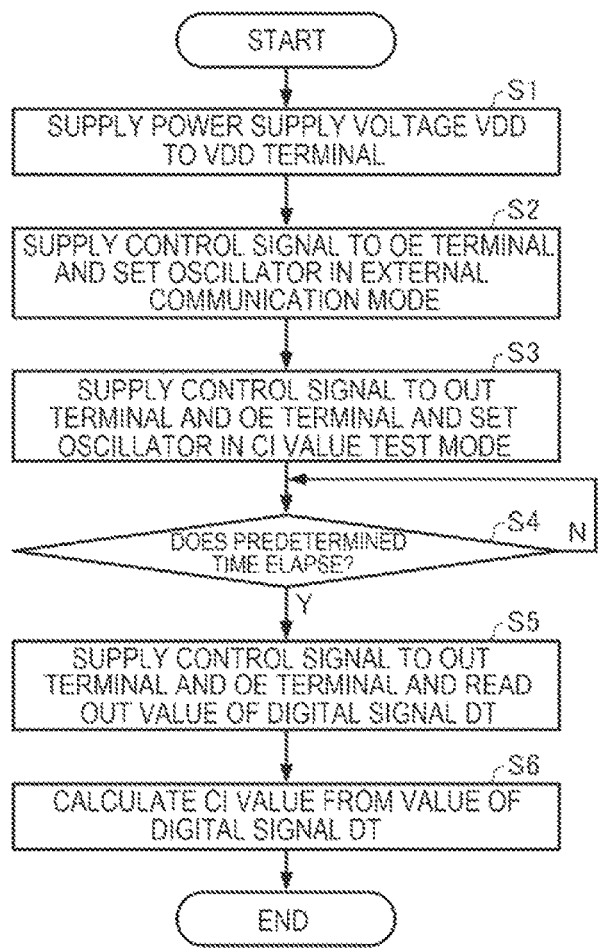
FIG. 9 is a flowchart showing an example of a procedure of a testing method of the CI value of the resonator.
Figure 10:
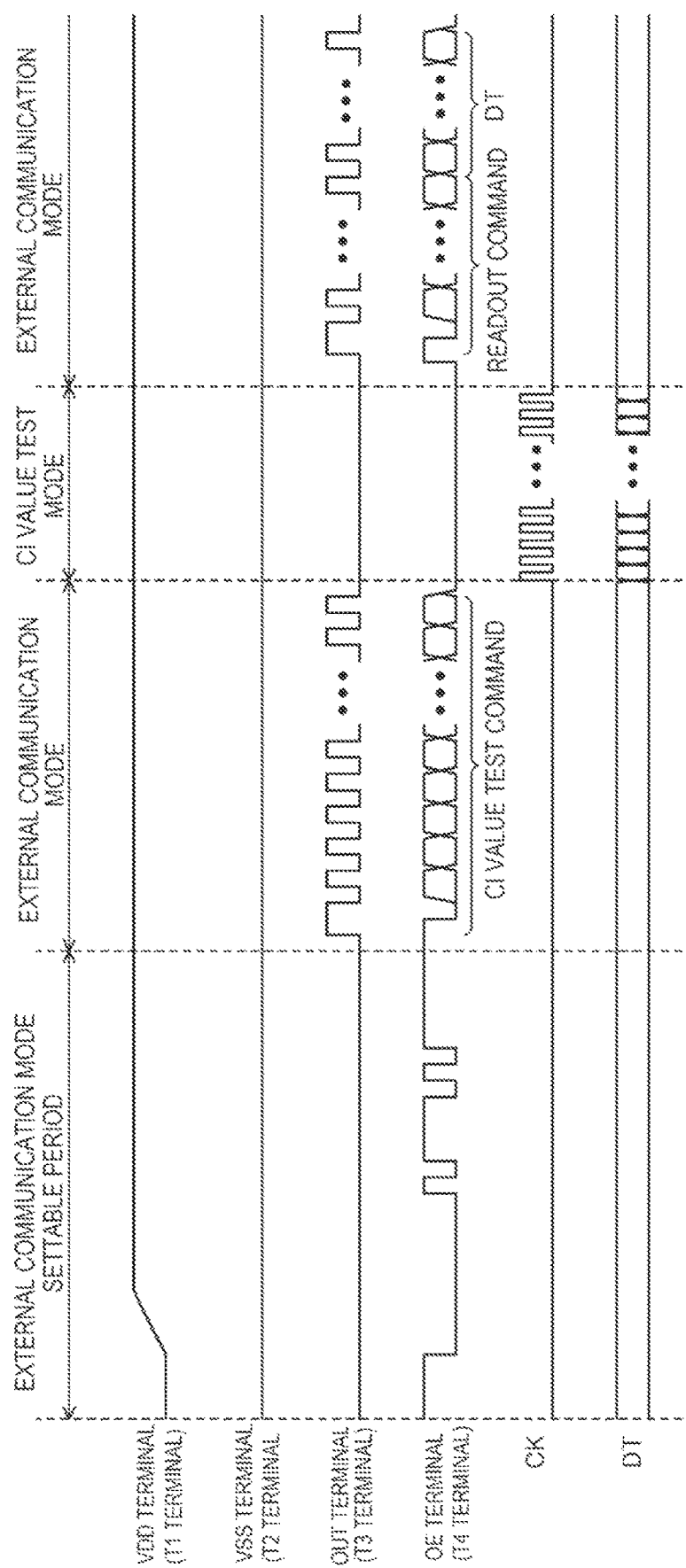
FIG. 10 shows an example of voltage waveforms of respective terminals, a clock signal, and a digital signal for testing of the CI value.

FIG. 9 is a flowchart showing an example of a procedure of a testing method of the CI value of the resonator 3 of the oscillator 1 of the embodiment. FIG. 10 shows an example of voltage waveforms of the respective terminals, the clock digital CK, and the digital signal DT for testing of the CI value using the flowchart in FIG. 9.

In the example in FIG. 9, first, at step S1, the testing device supplies the power supply voltage VDD to the VDD terminal of the oscillator 1. As shown in FIG. 10, by the step S1, the VDD terminal rises from the ground voltage to a desired voltage. Further, various kinds of information stored in the non-volatile memory 42 is transferred to the register 41 and supplied to the respective circuits.

Then, at step S2, the testing device supplies the control signal to the OE terminal of the oscillator 1 and sets the oscillator 1 in the external communication mode. That is, as shown in FIG. 10, the testing device supplies a signal in a predetermined pattern to the OE terminal of the oscillator 1 and sets the oscillator 1 in the external communication mode within a predetermined period after the power supply voltage VDD is supplied to the VDD terminal.

Then, at step S3, the testing device supplies the control signal to the OUT terminal and the OE terminal of the oscillator 1 and sets the oscillator 1 in the CI value test mode. That is, as shown in FIG. 10, in the external communication mode, the testing device supplies the serial clock signal to the OUT terminal, supplies the CI value test command as the serial data signal to the OE terminal, and sets the oscillator 1 in the CI value test mode. Thereby, the oscillator 1 changes from the external communication mode to the CI value test mode. In the CI value test mode, the clock signal CK is output from the second oscillation circuit 24 of the digital signal generation circuit 20, and the value of the digital signal DT increases with respect to each pulse of the clock signal CK by the count operation of the counter 26.

Then, at step S4, the testing device waits until a predetermined time elapses. As shown in FIG. 10, when the predetermined time elapses after the oscillator 1 changes to the CI value test mode, the output of the clock signal CK from the second oscillation circuit 24 stops. Thereby, the increase of the value of the digital signal DT also stops, the value of the digital signal DT is stored in the register 41, and the oscillator 1 changes from the CI value test mode to the external communication mode.

When the predetermined time elapses at step S4, at step S5, the testing device supplies the control signal to the OUT terminal and the OE terminal of the oscillator 1 and reads out the value of the digital signal DT. That is, as shown in FIG. 10, in the external communication mode, the testing device supplies the serial clock signal to the OUT terminal, supplies a readout command of the value of the digital signal DT as the serial data signal to the OE terminal, and acquires the digital signal DT output from the OE signal in synchronization with the serial clock signal.

Finally, at step S6, the testing device calculates the CI value of the resonator 3 from the value of the digital signal DT read out at step S5.

1-5. Functions and Effects

As described above, in the oscillator 1 of the first embodiment, the resonator 3 is harder to oscillate as the CI value is higher, and the voltage VAGC for automatic gain control for controlling the amplitude of the signal output from the resonator 3 changes according to the CI value of the resonator 3. Then, in the CI value test mode, the oscillation frequency of the second oscillation circuit 24 changes according to the voltage VAGC, and the count value obtained by the counter 26 performing the count operation based on the output signal of the second oscillation circuit 24 changes according to the CI value. As a result, the value of the digital signal DT based on the count value also changes according to the CI value. That is, the digital signal DT has the value according to the CI value of the resonator 3. Then, the digital signal DT is stored in the register 41 and, in the external communication mode, output from the T4 terminal in response to the readout command from the external device. The T4 terminal is a terminal coupled to the interface circuit 70, but not coupled to the electrode of the resonator 3. Therefore, according to the oscillator 1 of the first embodiment, the circuit device 2 may output the digital signal DT according to the CI value of the resonator 3 from the T4 terminal not coupled to the electrode of the resonator 3 in the external communication mode.

Further, according to the oscillator 1 of the first embodiment, in the circuit device 2, the second oscillation circuit 24 is realized by the ring oscillator having the simple configuration including the logic inverting elements 241, 242, 243, and thereby, the area of the second oscillation circuit 24 may be made smaller and that is advantageous for downsizing.

Furthermore, according to the oscillator 1 of the first embodiment, in the circuit device 2, the alternating-current signal component by the oscillation of the resonator 3 contained in the voltage VAGC is reduced by the filter circuit 22, and thereby, the digital signal DT highly correlating with the CI value of the resonator 3 may be output. Therefore, the testing device may perform testing of the CI value with higher accuracy.

In the oscillator 1 of the first embodiment, in the circuit device 2, the T4 terminal to which the signal for control of the output of the oscillation signal OSCO from the OUT terminal in the normal operation mode is also used as the terminal outputting the digital signal DT according to the CI value of the resonator 3. Accordingly, the oscillator 1 can output the digital signal DT according to the CI value of the resonator 3 from the OE terminal coupled to the T4 terminal. Therefore, the testing device may test the CI value of the resonator 3 based on the digital signal DT output from the OE terminal, and thereby, it is not necessary to provide a dedicated terminal for testing of the CI value in the package 4 of the oscillator 1 and the package 4 can be downsized. Further, according to the oscillator 1 of the first embodiment, a dedicated measuring instrument measuring the current flowing in the electrode of the resonator 3 is not necessary for testing of the CI value of the resonator 3, and thereby, testing man-hours and testing costs may be reduced.

2. Second Embodiment

As below, the oscillator 1 of a second embodiment will be explained mainly regarding differences from the first embodiment. The same configurations as those of the first embodiment have the same signs and the same explanations as those of the first embodiment are omitted or simplified.

Figure 11:
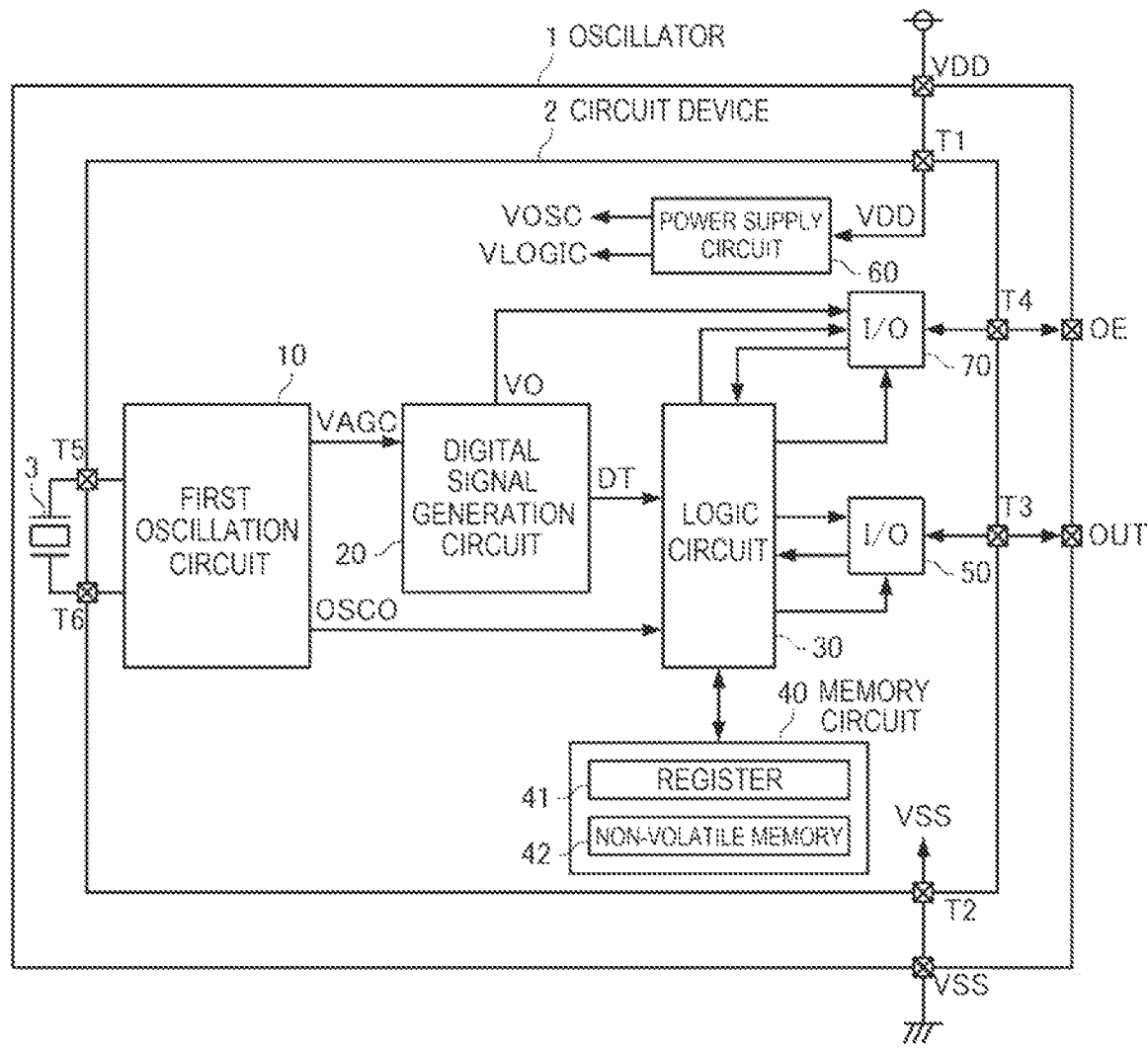
FIG. 11 is a functional block diagram of the oscillator of a second embodiment.

FIG. 11 is a functional block diagram of the oscillator 1 of the second embodiment. As shown in FIG. 11, in the oscillator 1 of the second embodiment, the circuit device 2 includes the first oscillation circuit 10, the digital signal generation circuit 20, the logic circuit 30, the memory circuit 40, the interface circuit 50, the power supply circuit 60, and the interface circuit 70 like the first embodiment.

In the normal operation mode, the logic circuit 30 controls the interface circuit 50 to output the oscillation signal OSCO output from the logic circuit 30 to the T3 terminal, and controls the interface circuit 70 to output the signal input from the T4 terminal to the logic circuit 30. Thereby, when the OE terminal is at the high level, the oscillation signal OSCO is output from the OUT terminal and, when the OE terminal is at the low level, the ground voltage VSS is output from the OUT terminal. That is, in the normal operation mode, the output of the oscillation signal OSCO from the OUT terminal is controlled based on the signal input to the OE terminal.

Further, in the external communication mode, the logic circuit 30 controls the interface circuit 50 to output the serial clock signal input from the T3 terminal to the logic circuit 30, and controls the interface circuit 70 to output the serial data signal input from the T4 terminal to the logic circuit 30 or output the signal output from the logic circuit 30 as the serial data signal to the T4 terminal according to a predetermined communication standard.

Furthermore, in the CI value test mode, the logic circuit 30 controls the interface circuit 70 to output a voltage VO output from the digital signal generation circuit 20 to the T4 terminal. The voltage VO is a voltage based on the voltage VAGC. The interface circuit 70 outputs the voltage VO to the T4 terminal, and thereby, the voltage VO is output from the OE terminal.

Figure 12:
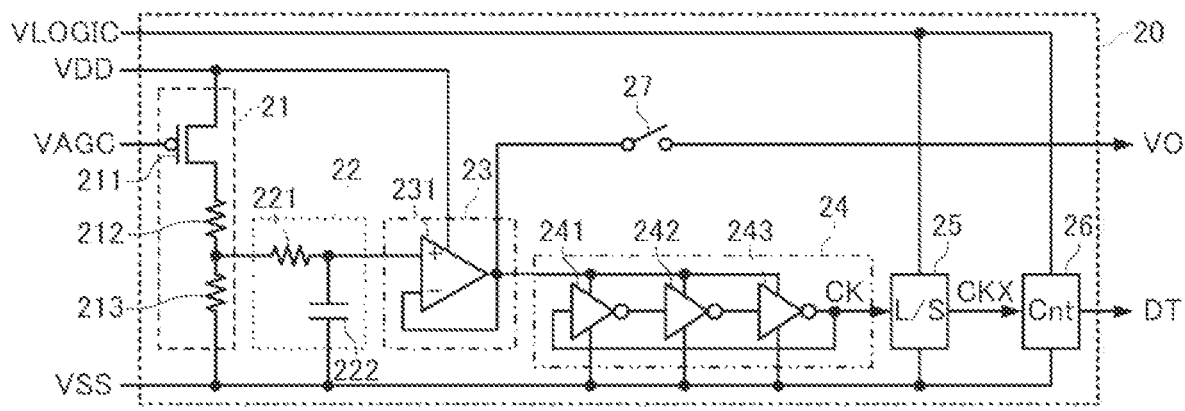
FIG. 12 shows a configuration example of the digital signal generation circuit in the second embodiment.

FIG. 12 shows a configuration example of the digital signal generation circuit 20 in the second embodiment. As shown in FIG. 12, the digital signal generation circuit 20 in the second embodiment includes the impedance conversion circuit 21, the filter circuit 22, the voltage buffer circuit 23, the second oscillation circuit 24, the level-shift circuit 25, and the counter 26 like the first embodiment, and further includes a switch element 27. The functions and configurations of the impedance conversion circuit 21, the filter circuit 22, the voltage buffer circuit 23, the second oscillation circuit 24, the level-shift circuit 25, and the counter 26 are the same as those of the first embodiment.

The switch element 27 has one end electrically coupled to the output terminal of the operational amplifier 231 of the voltage buffer circuit 23. The switch element 27 turns off in the external communication mode and the normal operation mode and the other end of the switch element 27 is in a high-impedance state under the control by the logic circuit 30. Further, the switch element 27 turns on in the CI value test mode and the voltage VO is output from the other end of the switch element 27 under the control by the logic circuit 30. The voltage VO is the output voltage of the voltage buffer circuit 23 based on the voltage VAGC.

The other configurations of the oscillator 1 of the second embodiment are the same as those of the oscillator 1 of the first embodiment and the explanation thereof is omitted.

Note that, in the embodiment, the T4 terminal is an example of the first terminal and an example of a second terminal. The voltage VAGC is an example of the first voltage, and the voltage VO is an example of a second voltage. The interface circuit 70 is an example of the first interface circuit and an example of a second interface circuit. The OE terminal is an example of the first external terminal and an example of a third external terminal. The OUT terminal is an example of a second external terminal.

In the above described oscillator 1 of the second embodiment, in the circuit device 2, in the CI value test mode, the interface circuit 70 outputs the voltage VO correlating with the CI value of the resonator 3 to the T4 terminal. Therefore, the testing device may determine validity of the value of the digital signal DT output from the OE terminal in the external communication mode based on the voltage VO output from the OE terminal coupled to the T4 terminal in the CI value test mode.

Further, in the oscillator 1 of the second embodiment, in the normal operation mode, the output of the oscillation signal OSCO from the OUT terminal is controlled based on the signal input to the OE terminal and, in the CI value test mode, the voltage VO is output from the OE terminal. That is, the OE terminal to which the signal for control of the output of the oscillation signal OSCO from the OUT terminal is input in the normal operation mode is also used as the external terminal from which the voltage VO is output in the CI value test mode. Therefore, according to the oscillator 1 of the second embodiment, it is not necessary to provide a dedicated terminal from which the voltage VO is output in the package 4 and the package 4 can be downsized.

The oscillator 1 of the second embodiment exerts the same effects as those of the oscillator 1 of the above described first embodiment in addition to the above described effects.

3. Third Embodiment

As below, the oscillator 1 of a third embodiment will be explained mainly regarding differences from the first embodiment and the second embodiment. The same configurations as those of the first embodiment or the second embodiment have the same signs and the same explanations as those of the first embodiment or the second embodiment are omitted or simplified.

Figure 13:
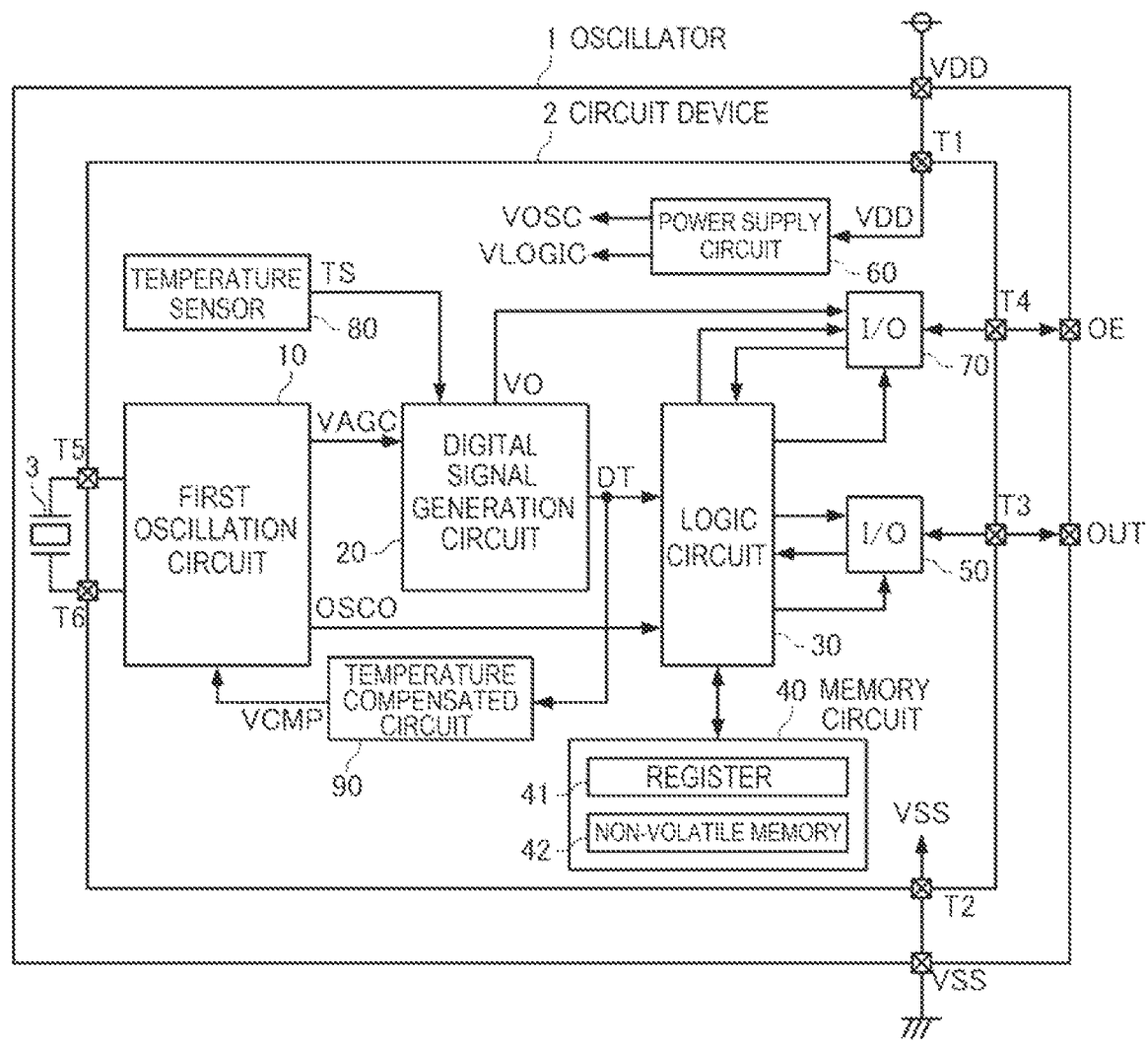
FIG. 13 is a functional block diagram of the oscillator of a third embodiment.

FIG. 13 is a functional block diagram of the oscillator 1 of the third embodiment. As shown in FIG. 13, in the oscillator 1 of the third embodiment, the circuit device 2 includes the first oscillation circuit 10, the digital signal generation circuit 20, the logic circuit 30, the memory circuit 40, the interface circuit 50, the power supply circuit 60, and the interface circuit 70 like the second embodiment, and further includes a temperature sensor 80 and a temperature compensated circuit 90.

The temperature sensor 80 detects the temperature of the circuit device 2 and outputs a temperature signal TS according to the temperature. In the embodiment, the temperature signal TS is a signal having a frequency changing according to the temperature. The temperature signal TS may be a signal having a frequency higher as the temperature is higher or a signal having a frequency lower as the temperature is higher. For example, the temperature sensor 80 may include a circuit generating a bias current having temperature dependency, a ring oscillator having a frequency changing according to the temperature by operation based on the bias current, and a level-shift circuit shifting an upper limit voltage at the high level of the oscillation signal output from the ring oscillator from the power supply voltage VDD to the voltage VLOGIC and outputting the temperature signal TS.

The temperature compensated circuit 90 generates a temperature-compensated signal VCMP for control of the oscillation frequency of the first oscillation circuit 10, and outputs the temperature-compensated signal VCMP to the first oscillation circuit 10. In the embodiment, in the normal operation mode, the value of the digital signal DT changes according to the frequency of the temperature signal TS, and the temperature compensated circuit 90 generates the temperature-compensated signal VCMP based on the digital signal DT. For example, temperature-compensated data according to the frequency-temperature characteristics of the resonator 3 may be stored in the non-volatile memory 42, and the temperature compensated circuit 90 may generate the temperature-compensated signal VCMP based on the digital signal DT and the temperature-compensated data.

The temperature-compensated signal VCMP is supplied to the first oscillation circuit 10, and thereby, regarding the oscillation signal OSCO output by the first oscillation circuit 10, the frequency deviation of the oscillation signal OSCO in a predetermined temperature range in which the operation of the circuit device 2 is ensured is equal to or smaller than a value determined by the specifications. Thereby, the oscillation signal OSCO has a substantially constant frequency at any temperature within the predetermined temperature range.

Figure 14:
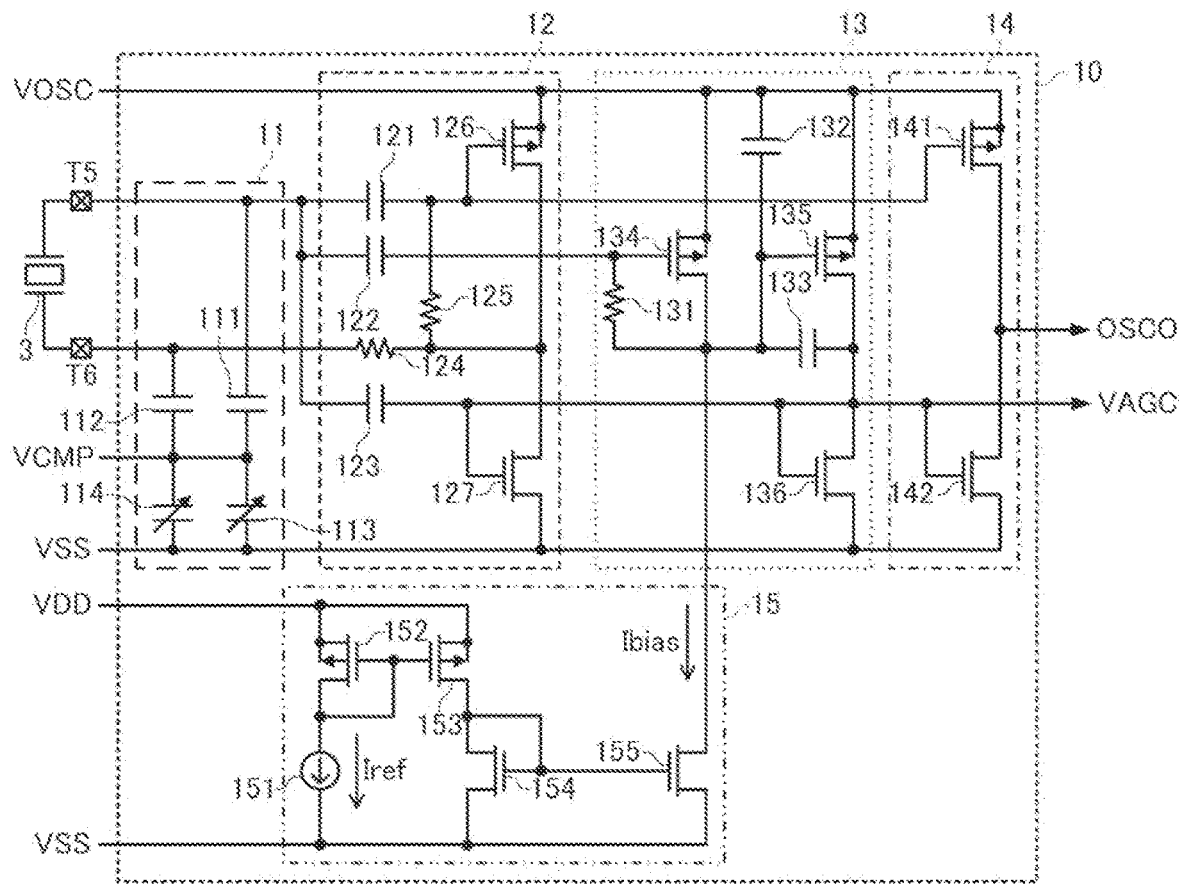
FIG. 14 shows a configuration example of the first oscillation circuit in the third embodiment.

FIG. 14 shows a configuration example of the first oscillation circuit 10 in the third embodiment. As shown in FIG. 14, the first oscillation circuit 10 includes the capacitance circuit 11, the amplification circuit 12, the automatic gain control circuit 13, the output circuit 14, and the bias current generation circuit 15 like the first embodiment. The functions and configurations of the amplification circuit 12, the automatic gain control circuit 13, the output circuit 14, and the bias current generation circuit 15 are the same as those of the first embodiment, but the functions and configurations of the capacitance circuit 11 are different from those of the first embodiment.

As shown in FIG. 14, the capacitance circuit 11 includes the capacitive elements 111, 112 and variable capacitive elements 113, 114. The capacitive element 111 has one end electrically coupled to the T5 terminal and the other end electrically coupled to one end of the variable capacitive element 113. The ground voltage VSS is supplied to the other end of the variable capacitive element 113. The capacitive element 112 has one end electrically coupled to the T6 terminal and the other end electrically coupled to one end of the variable capacitive element 114. The ground voltage VSS is supplied to the other end of the variable capacitive element 114. The temperature-compensated signal VCMP output from the temperature compensated circuit 90 is supplied to one end of the variable capacitive element 113 and one end of the variable capacitive element 114. The capacitance values of the variable capacitive elements 113, 114 change according to the voltage of the temperature-compensated signal VCMP. For example, the capacitance values of the variable capacitive elements 113, 114 may be larger as the voltage of the temperature-compensated signal VCMP is higher, or the capacitance values of the variable capacitive elements 113, 114 may be smaller as the voltage of the temperature-compensated signal VCMP is higher. For example, the variable capacitive elements 113, 114 may be respectively varactors to which sources and drains of MOS transistors are coupled.

The capacitance value of the capacitance circuit 11 having the above described configuration changes according to the temperature-compensated signal VCMP. The capacitance circuit 11 functions as load capacitance of the resonator 3, and the frequency of the oscillation signal OSCO changes according to the capacitance value of the capacitance circuit 11. As a result, the oscillation signal OSCO has a substantially constant frequency at any temperature within a predetermined temperature range in which the operation of the circuit device 2 is ensured.

Note that, in place of the variable capacitive element 113, a capacitance array in which a plurality of capacitive elements are series-coupled respectively via switch elements may be used. Similarly, in place of the variable capacitive element 114, a capacitance array in which a plurality of capacitive elements are series-coupled respectively via switch elements may be used. In this case, the temperature-compensated signal VCMP is a digital signal and the respective switches are turned on or off according to the voltages of the respective bits of the temperature-compensated signal VCMP.

Figure 15:
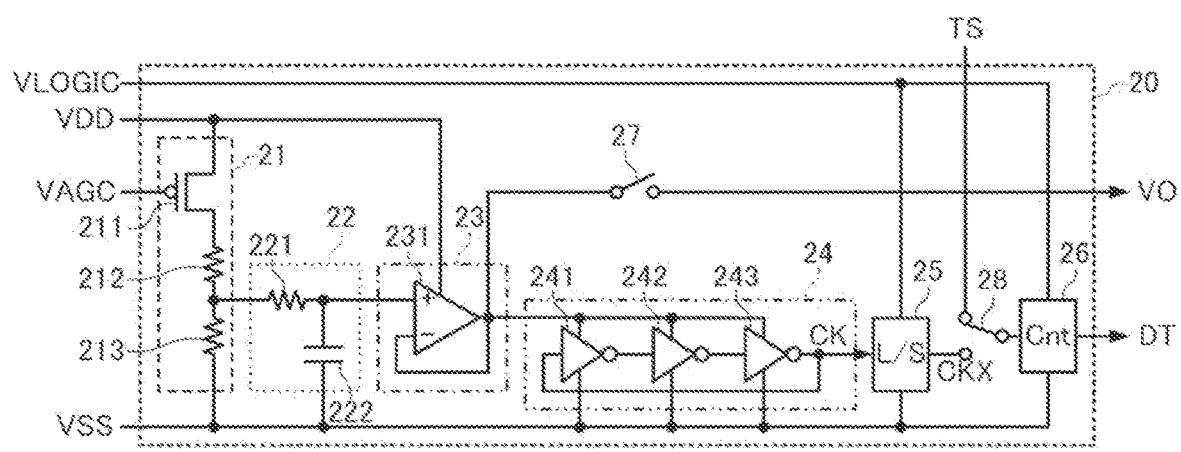
FIG. 15 shows a configuration example of the digital signal generation circuit in the third embodiment.

FIG. 15 shows a configuration example of the digital signal generation circuit 20 in the third embodiment. As shown in FIG. 15, the digital signal generation circuit 20 in the third embodiment includes the impedance conversion circuit 21, the filter circuit 22, the voltage buffer circuit 23, the second oscillation circuit 24, the level-shift circuit 25, the counter 26, and the switch element 27 like the second embodiment, and further includes a selector 28. The functions and configurations of the impedance conversion circuit 21, the filter circuit 22, the voltage buffer circuit 23, the second oscillation circuit 24, and the level-shift circuit 25 are the same as those of the first embodiment and the functions and configurations of the switch element 27 are the same as those of the second embodiment. Note that the switch element 27 is not necessarily provided.

The selector 28 selects and outputs one of the temperature signal TS output from the temperature sensor 80 or the clock signal CKX output from the level-shift circuit 25 to the counter 26. Specifically, the selector 28 selects the temperature signal TS in the normal operation mode and selects the clock signal CKX in the CI value test mode according to the control by the logic circuit 30.

The output signal of the selector 28 is input to the counter 26, and the counter performs count operation. Specifically, in the normal operation mode, the counter 26 performs count operation based on the output signal of the temperature sensor 80. That is, the temperature signal TS as the output signal of the temperature sensor 80 is input to the counter 26, and the counter 26 counts the contained pulse number of the temperature signal TS in a predetermined time. The predetermined time may be e.g. a time of predetermined periods of the oscillation signal OSCO. In the normal operation mode, the count value by the counter 26 is output to the temperature compensated circuit 90 as the digital signal DT, and the temperature compensated circuit 90 generates the temperature-compensated signal VCMP according to the count value of the counter 26.

Further, in the CI value test mode, the counter 26 performs count operation based on the clock signal CK as the output signal of the second oscillation circuit 24. That is, the clock signal CKX as the signal based on the clock signal CK is input to the counter 26, and the counter counts the contained pulse number of the clock signal CKX in a predetermined time. The predetermined time may be e.g. a time of predetermined periods of the oscillation signal OSCO. In the CI value test mode, the count value by the counter 26 is output to the logic circuit 30 as the digital signal DT, and the logic circuit 30 stores the count value of the counter 26 in the register 41.

The other configurations of the oscillator 1 of the third embodiment are the same as those of the oscillator 1 of the second embodiment and the explanation thereof is omitted.

Note that, in the embodiment, the T4 terminal is an example of the first terminal and an example of the second terminal. The voltage VAGC is an example of the first voltage, and the voltage VO is an example of the second voltage. The interface circuit 70 is an example of the first interface circuit and an example of the second interface circuit. The normal operation mode is an example of a first mode, the CI value test mode is an example of a second mode, and the external communication mode is an example of a third mode. The OE terminal is an example of the first external terminal and an example of the third external terminal. The OUT terminal is an example of the second external terminal.

In the above described oscillator 1 of the third embodiment, in the circuit device 2, the counter 26 used in the normal operation mode realizing a temperature compensation function is also used in the CI value test mode for testing the CI value of the resonator 3. Therefore, according to the oscillator 1 of the third embodiment, in the circuit device 2, the oscillation signal OSCO having the smaller frequency deviation may be generated by the temperature compensation function, and the circuit area increasing for testing of the CI value of the resonator 3 may be reduced.

The oscillator 1 of the third embodiment exerts the same effects as those of the oscillator 1 of the above described first embodiment or second embodiment in addition to the above described effects.

4. Fourth Embodiment

As below, the oscillator 1 of a fourth embodiment will be explained mainly regarding differences from the first embodiment to the third embodiment. The same configurations as those of the first embodiment to the third embodiment have the same signs and the same explanations as those of the first embodiment to the third embodiment are omitted or simplified.

A functional block diagram of the oscillator 1 of the fourth embodiment is the same as the functional block diagram of the oscillator 1 of the first embodiment shown in FIG. 5, the functional block diagram of the oscillator 1 of the second embodiment shown in FIG. 11, or the functional block diagram of the oscillator 1 of the third embodiment shown in FIG. 13, and the illustration thereof is omitted. In the oscillator 1 of the fourth embodiment, the configuration of the digital signal generation circuit 20 is different from those of the first embodiment to the third embodiment.

Figure 16:
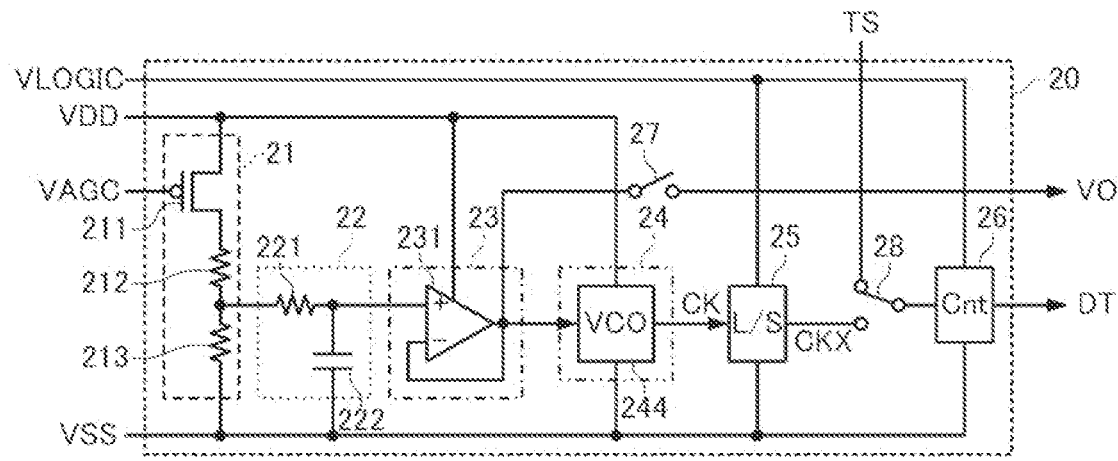
FIG. 16 shows a configuration example of the digital signal generation circuit in a fourth embodiment.

FIG. 16 shows a configuration example of the digital signal generation circuit 20 in the fourth embodiment. As shown in FIG. 16, the digital signal generation circuit 20 in the fourth embodiment includes the impedance conversion circuit 21, the filter circuit 22, the voltage buffer circuit 23, the second oscillation circuit 24, the level-shift circuit 25, the counter 26, the switch element 27, and the selector 28 like the third embodiment. The functions and configurations of the impedance conversion circuit 21, the filter circuit 22, the voltage buffer circuit 23, and the level-shift circuit 25 are the same as those of the first embodiment. The functions and configurations of the switch element 27 are the same as those of the second embodiment. The functions and configurations of the counter 26 and the selector 28 are the same as those of the third embodiment. Note that the switch element 27 is not necessarily provided.

Like that in the first embodiment to the third embodiment, the second oscillation circuit 24 has the oscillation frequency changing according to the voltage VAGC. Note that, while the second oscillation circuit 24 is the ring oscillator in the first embodiment to the third embodiment, the second oscillation circuit 24 is a VCO 244 in the fourth embodiment. VCO is an abbreviation for Voltage Controlled Oscillator.

The power supply voltage VDD is supplied to the VCO 244 and the oscillation frequency changes according to the output voltage of the voltage buffer circuit 23. Specifically, the higher the output voltage of the voltage buffer circuit 23, the higher the oscillation frequency of the VCO 244. For example, the VCO 244 may be a Hartley oscillator or a Colpitts oscillator having an oscillation frequency changing when the capacitance value of the variable capacitive element changes according to the output voltage of the voltage buffer circuit 23.

The clock signal CK output from the VCO 244 is input to the counter 26 via the level-shift circuit 25 and the counter 26 performs count operation based on the clock signal CK like the first to third embodiments. Then, the count value by the counter 26 is output to the logic circuit 30 as the digital signal DT.

The other configurations of the oscillator 1 of the fourth embodiment are the same as those of the oscillator 1 of one of the first embodiment to the third embodiment and the explanation thereof is omitted.

In the above described oscillator 1 of the fourth embodiment, like the first embodiment to the third embodiment, the higher the CI value of the resonator 3, the higher the voltage VAGC and the lower the output voltage of the voltage buffer circuit 23, and the smaller the value of the digital signal DT as the count value by the counter 26. Therefore, the testing device as an external device may test the CI value of the resonator 3 based on the value of the digital signal DT.

The oscillator 1 of the fourth embodiment exerts the same effects as those of the oscillators 1 of the above described first embodiment to third embodiment in addition to the above described effects.

5. Fifth Embodiment

As below, the oscillator 1 of a fifth embodiment will be explained mainly regarding differences from the first embodiment and the second embodiment. The same configurations as those of the first embodiment or the second embodiment have the same signs and the same explanations as those of the first embodiment or the second embodiment are omitted or simplified.

A functional block diagram of the oscillator 1 of the fifth embodiment is the same as the functional block diagram of the oscillator 1 of the first embodiment shown in FIG. 5 or the functional block diagram of the oscillator 1 of the second embodiment shown in FIG. 11, and the illustration thereof is omitted. In the oscillator 1 of the fifth embodiment, the configuration of the digital signal generation circuit 20 is different from those of the first embodiment and the second embodiment.

Figure 17:
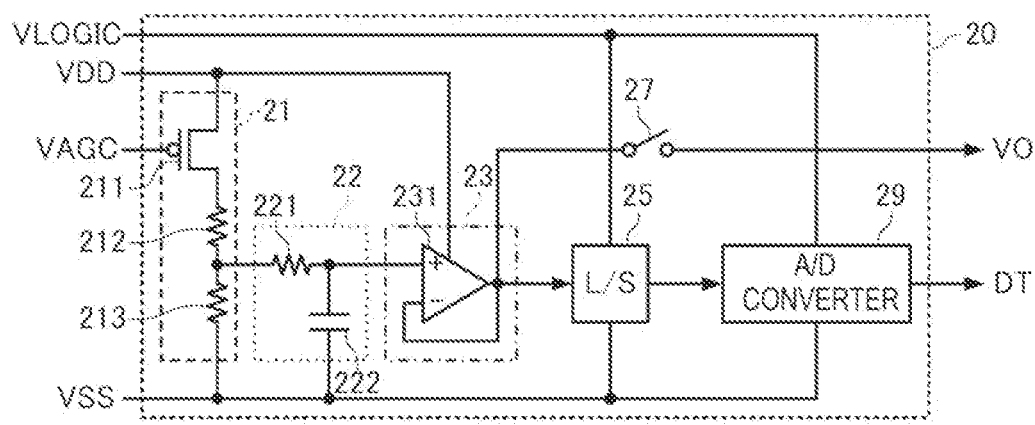
FIG. 17 shows a configuration example of the digital signal generation circuit in a fifth embodiment.

FIG. 17 shows a configuration example of the digital signal generation circuit 20 in the fifth embodiment. As shown in FIG. 17, the digital signal generation circuit 20 in the fifth embodiment includes the impedance conversion circuit 21, the filter circuit 22, the voltage buffer circuit 23, the level-shift circuit 25, and the switch element 27 like the second embodiment, and further includes an A/D converter 29 in place of the second oscillation circuit 24 and the counter 26. The functions and configurations of the impedance conversion circuit 21, the filter circuit 22, the voltage buffer circuit 23, and the level-shift circuit 25 are the same as those of the first embodiment. The functions and configurations of the switch element 27 are the same as those of the second embodiment. Note that the switch element 27 is not necessarily provided.

In the embodiment, the output voltage of the voltage buffer circuit 23 is input to the level-shift circuit 25 and the output signal of the level-shift circuit 25 is input to the A/D converter 29. The A/D converter 29 operates using the voltage VLOGIC as the power supply voltage and converts the output signal of the level-shift circuit 25 as an analog signal into the digital signal DT. Specifically, the higher the voltage of the output signal of the level-shift circuit 25, the larger the value of the digital signal DT. Then, the digital signal DT output from the A/D converter 29 is output to the logic circuit 30.

The other configurations of the oscillator 1 of the fifth embodiment are the same as those of the oscillator 1 of one of the first embodiment to the third embodiment and the explanation thereof is omitted.

In the above described oscillator 1 of the fifth embodiment, like the first embodiment or the second embodiment, the higher the CI value of the resonator 3, the higher the voltage VAGC and the higher the output voltage of the voltage buffer circuit 23, and the smaller the value of the digital signal DT. Therefore, the testing device as an external device may test the CI value of the resonator 3 based on the value of the digital signal DT.

The oscillator 1 of the fifth embodiment exerts the same effects as those of the oscillator 1 of the above described first embodiment or second embodiment in addition to the above described effects.

6. Sixth Embodiment

As below, the oscillator 1 of a sixth embodiment will be explained mainly regarding differences from the first embodiment and the second embodiment. The same configurations as those of the first embodiment or the second embodiment have the same signs and the same explanations as those of the first embodiment or the second embodiment are omitted or simplified.

A functional block diagram of the oscillator 1 of the sixth embodiment is the same as the functional block diagram of the oscillator 1 of the first embodiment shown in FIG. 5 or the functional block diagram of the oscillator 1 of the second embodiment shown in FIG. 11, and the illustration thereof is omitted. In the oscillator 1 of the sixth embodiment, the configuration of the digital signal generation circuit 20 is different from those of the first embodiment and the second embodiment.

Figure 18:
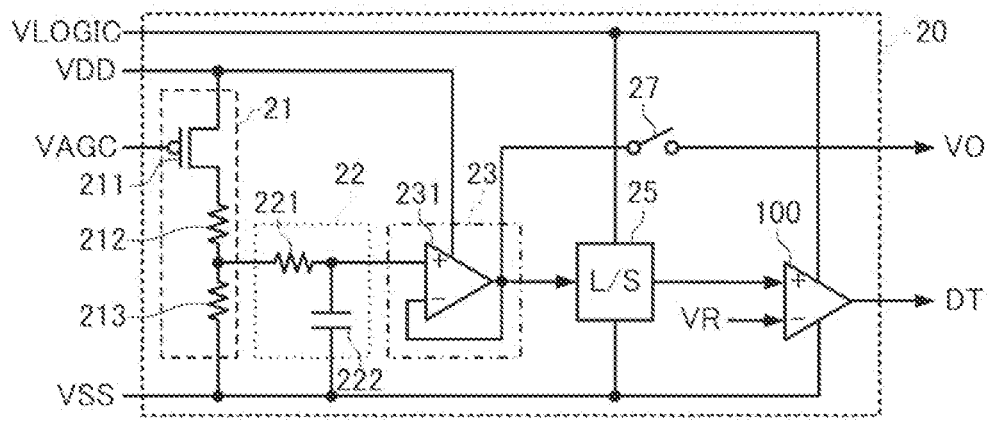
FIG. 18 shows a configuration example of the digital signal generation circuit in a sixth embodiment.

FIG. 18 shows a configuration example of the digital signal generation circuit 20 in the sixth embodiment. As shown in FIG. 18, the digital signal generation circuit 20 in the sixth embodiment includes the impedance conversion circuit 21, the filter circuit 22, the voltage buffer circuit 23, the level-shift circuit 25, and the switch element 27 like the second embodiment, and further includes a comparator 100 in place of the second oscillation circuit 24 and the counter 26. The functions and configurations of the impedance conversion circuit 21, the filter circuit 22, the voltage buffer circuit 23, and the level-shift circuit 25 are the same as those of the first embodiment. The functions and configurations of the switch element 27 are the same as those of the second embodiment. Note that the switch element 27 is not necessarily provided.

In the embodiment, the output voltage of the voltage buffer circuit 23 is input to the level-shift circuit 25 and the output signal of the level-shift circuit 25 is input to the comparator 100. The comparator 100 operates using the voltage VLOGIC as the power supply voltage and converts the output signal of the level-shift circuit 25 as an analog signal into the binarized digital signal DT. Specifically, when the voltage of the output signal of the level-shift circuit 25 is higher than the reference voltage VR, the digital signal DT is at the high level and, when the voltage of the output signal of the level-shift circuit 25 is lower than the reference voltage VR, the digital signal DT is at the low level. Then, the digital signal DT output from the comparator 100 is output to the logic circuit 30.

The other configurations of the oscillator 1 of the sixth embodiment are the same as those of the oscillator 1 of one of the first embodiment to the third embodiment and the explanation thereof is omitted.

In the above described oscillator 1 of the sixth embodiment, like the first embodiment or the second embodiment, the higher the CI value of the resonator 3, the higher the voltage VAGC and the lower the output voltage of the voltage buffer circuit 23. Accordingly, in a case where the output voltage of the voltage buffer circuit 23 is equal to the reference voltage VR when the CI value is a predetermined value, when the CI value is higher than the predetermined value, the digital signal DT is at the low level and, when the CI value is lower than the predetermined value, the digital signal DT is at the high level. Therefore, the reference voltage VR is appropriately set, and thereby, the testing device as an external device may determine that the CI value is normal when the digital signal DT is at the low level and determine that the CI value is abnormal when the digital signal DT is at the high level.

The oscillator 1 of the sixth embodiment exerts the same effects as those of the oscillator 1 of the above described first embodiment or second embodiment in addition to the above described effects.

7. Modified Examples

The present disclosure is not limited to the embodiments and various modifications can be made within the scope of the present disclosure.

In the oscillators 1 of the above described first embodiment to third embodiment, the second oscillation circuit 24 is the ring oscillator, however, not limited to that. For example, the second oscillation circuit 24 may be an RC oscillation circuit or an LC oscillation circuit.

Further, in the oscillators 1 of the above described second embodiment to sixth embodiment, both the digital signal DT and the voltage VO are output from the OE terminal via the interface circuit 70 and the T4 terminal, however, may be output from two external terminals different from each other via two interface circuits and two terminals different from each other. That is, in the oscillators 1 of the above described second embodiment to sixth embodiment, the first terminal and the second terminal are the same T4 terminal, however, the first terminal and the second terminal may be different terminals and, for example, the T3 terminal may be the first terminal and the T4 terminal may be the second terminal. Similarly, in the oscillators 1 of the above described second embodiment to sixth embodiment, the first interface circuit and the second interface circuit are the same interface circuit 70, however, the first interface circuit and the second interface circuit may be different circuits and, for example, the interface circuit 50 may be the first interface circuit and the interface circuit 70 may be the second interface circuit. Similarly, in the oscillators 1 of the above described second embodiment to sixth embodiment, the first external terminal and the third external terminal are the same external terminal, however, the first external terminal and the third external terminal may be different external terminals and, for example, the OUT terminal may be the first external terminal and the OE terminal may be the third external terminal. Therefore, for example, the digital signal DT may be output from the OUT terminal via the interface circuit 50 and the T3 terminal and the voltage VO may be output from the OE terminal via the interface circuit 70 and the T4 terminal.

In the above described oscillator 1 of the fourth embodiment, the second oscillation circuit 24 is the VCO, however, not limited to that. For example, the second oscillation circuit 24 may be a VCXO. The VCXO is an abbreviation for Voltage Controlled Crystal Oscillator. Further, when the circuit device 2 is realized by an integrated circuit, the second oscillation circuit 24 is a circuit formed by removal of the crystal quartz resonator of the VCXO and the crystal quartz resonator may be externally attached to the circuit device 2.

In the above described respective embodiments, in the external communication mode, with respect to the circuit device 2, the serial clock signal is input from the OUT terminal and the serial data signal is input or output from the OE terminal, however, the terminals to which or from which the serial clock signal and the serial data signal are input or output may be other terminals.

In the above described respective embodiments, the circuit device 2 externally receives the CI value test command and the operation mode changes to the CI value test mode, however, the CI value of the resonator 3 may be self-diagnosed regardless of an external instruction. For example, the circuit device 2 may have a timer, and the logic circuit 30 may determine whether or not a predetermined time elapses based on the value of the timer, operate the digital signal generation circuit 20 and acquire the digital signal DT at each time when the predetermined time elapses, and diagnose whether or not the CI value of the resonator 3 is normal based on the value of the digital signal DT.

The oscillators 1 of the above described respective embodiments are simple oscillators such as SPXOs or oscillators having the temperature compensation function such as TCXOs, however, may be oscillators having a frequency control function such as VCXOs, oscillators having the temperature compensation function and the frequency control function such as VC-TCXOs, or oscillators having a temperature control function such as OCXOs. SPXO is an abbreviation for Simple Packaged Crystal Oscillator, TCXO is an abbreviation for Temperature Compensated Crystal Oscillator. VCXO is an abbreviation for Voltage Controlled Crystal Oscillator, and VC-TCXO is an abbreviation for Voltage Controlled Temperature Compensated Crystal Oscillator. OCXO is an abbreviation for Oven Controlled Crystal Oscillator.

The above described embodiments and modified examples are just examples and the present disclosure is not limited to those. For example, the respective embodiments and the respective modified examples can be appropriately combined.

The present disclosure includes substantially the same configurations as the configurations described in the embodiments, e.g. configurations having the same functions, the methods, and the results or configurations having the same purposes and effects. Further, the present disclosure includes configurations formed by replacement of the non-essential parts of the configurations described in the embodiments. Furthermore, the present disclosure includes configurations exerting the same functions and effects or configurations achieving the same purposes as those of the configurations described in the embodiments. In addition, the present disclosure includes configurations formed by addition of known techniques to the configurations described in the embodiments.

The following configurations are derived from the above described embodiments and modified examples.

An aspect of a circuit device includes a first terminal, a first oscillation circuit oscillating a resonator and generating a first voltage for automatic gain control for controlling amplitude of a signal output from the resonator, a digital signal generation circuit generating a digital signal corresponding to the first voltage, and a first interface circuit outputting the digital signal to the first terminal.

In the circuit device, the higher a CI value, the harder the resonator oscillates, and the first voltage for automatic gain control for controlling amplitude of the signal output from the resonator changes according to the CI value of the resonator. Accordingly, the digital signal corresponding to the first voltage has a value according to the CI value of the resonator. Further, the first terminal is a terminal coupled to the first interface circuit, but not coupled to an electrode of the resonator. Therefore, according to the circuit device, a signal according to the CI value of the resonator may be output from the first terminal not coupled to the electrode of the resonator.

In the aspect of the circuit device, the digital signal generation circuit may include a second oscillation circuit having an oscillation frequency changing according to the first voltage, and a counter performing count operation based on an output signal of the second oscillation circuit.

In the circuit device, the first voltage changes according to the CI value of the resonator and the oscillation frequency of the second oscillation circuit changes according to the first voltage, and thereby, the count value obtained by the counter performing count operation based on the output signal of the second oscillation circuit changes according to the CI value. As a result, the value of the digital signal based on the count value also changes according to the CI value. Therefore, according to the circuit device, the digital signal according to the CI value of the resonator may be output from the first terminal.

The aspect of the circuit device may further include a temperature sensor outputting a signal having a frequency changing according to a temperature, and a temperature compensated circuit generating a temperature-compensated signal for controlling an oscillation frequency of the first oscillation circuit and outputting the temperature-compensated signal to the first oscillation circuit, wherein, in a first mode, the counter may perform count operation based on the output signal of the temperature sensor and the temperature compensated circuit generates the temperature-compensated signal according to a count value of the counter, and, in a second mode, the counter may perform count operation based on the output signal of the second oscillation circuit.

In the circuit device, the counter used in the first mode realizing the temperature compensation function is also used in the second mode for testing the CI value of the resonator. Therefore, according to the circuit device, the oscillation signal having the smaller frequency deviation may be generated by the temperature compensation function, and the circuit area increasing for testing of the CI value of the resonator may be reduced.

In the aspect of the circuit device, the second oscillation circuit may be a ring oscillator.

According to the circuit device, the ring oscillator is a simple circuit, and the area of the second oscillation circuit may be made smaller and that is advantageous for downsizing.

In the aspect of the circuit device, the digital signal generation circuit may include an impedance conversion circuit to which the first voltage is input, a filter circuit smoothing an output voltage of the impedance conversion circuit, and a voltage buffer circuit buffering an output voltage of the filter circuit.

According to the circuit device, an alternating-current signal component by the oscillation of the resonator contained in the first voltage is reduced by the filter circuit, and thereby, the digital signal highly correlating with the CI value of the resonator may be output.

In the aspect of the circuit device, the impedance conversion circuit may include a P-channel type MOS transistor having a gate to which the first voltage is input, and a divider circuit dividing a voltage of a drain of the MOS transistor.

The aspect of the circuit device may further include a second terminal, and a second interface circuit outputting a second voltage based on the first voltage from the second terminal.

According to the circuit device, an external device may determine validity of the value of the digital signal output from the first terminal based on the second voltage output from the second terminal.

An aspect of an oscillator includes a resonator, and a circuit device electrically coupled to the resonator, wherein the circuit device includes a first terminal, a first oscillation circuit oscillating the resonator and generating a first voltage for automatic gain control for controlling amplitude of a signal output from the resonator, a digital signal generation circuit generating a digital signal corresponding to the first voltage, and a first interface circuit outputting the digital signal to the first terminal.

According to the oscillator, the external device may test the CI value of the resonator based on the digital signal output from the first terminal of the circuit device, and thereby, it is not necessary to provide a dedicated terminal coupled to the electrode of the resonator for testing of the CI value of the resonator and that is advantageous for downsizing. Further, according to the oscillator, a dedicated measuring instrument measuring the current flowing in the electrode of the resonator is not necessary for testing of the CI value of the resonator, and thereby, testing man-hours and testing costs may be reduced.

In the aspect of the oscillator, the digital signal generation circuit may include a second oscillation circuit having an oscillation frequency changing according to the first voltage, and a counter performing count operation based on an output signal of the second oscillation circuit.

In the oscillator, the first voltage changes according to the CI value of the resonator and the oscillation frequency of the second oscillation circuit changes according to the first voltage, and thereby, the count value obtained by the counter performing count operation based on the output signal of the second oscillation circuit changes according to the CI value. As a result, the value of the digital signal based on the count value also changes according to the CI value. Therefore, the external device may test the CI value of the resonator based on the digital signal output from the first terminal of the circuit device.

In the aspect of the oscillator, the circuit device may include a temperature sensor outputting a signal having a frequency changing according to a temperature, and a temperature compensated circuit generating a temperature-compensated signal for controlling an oscillation frequency of the first oscillation circuit and outputting the temperature-compensated signal to the first oscillation circuit, in a first mode, the counter may perform count operation based on the output signal of the temperature sensor and the temperature compensated circuit generates the temperature-compensated signal according to a count value of the counter, and, in a second mode, the counter may perform count operation based on the output signal of the second oscillation circuit.

In the oscillator, in the circuit device, the counter used in the first mode realizing the temperature compensation function is also used in the second mode for testing the CI value of the resonator. Therefore, according to the oscillator, in the circuit device, the oscillation signal having the smaller frequency deviation may be generated by the temperature compensation function, and the circuit area increasing for testing of the CI value of the resonator may be reduced.

The aspect of the oscillator may further include a package housing the circuit device and the resonator, wherein the package may have a first external terminal electrically coupled to the first terminal.

According to the oscillator, the external device may test the CI value of the resonator based on the digital signal output from the first external terminal.

In the aspect of the oscillator, the package may have a second external terminal, in the first mode, output from the second external terminal of an oscillation signal based on a signal output from the resonator may be controlled based on the signal input from the first external terminal, and, in a third mode, the digital signal may be output from the first external terminal.

In the oscillator, as an external terminal to which the digital signal corresponding to the first voltage is output in the third mode, the first external terminal to which the signal for controlling the output of the oscillation signal from the second external terminal in the first mode is input is also used. Therefore, the external device may test the CI value of the resonator based on the digital signal output from the first external terminal, and thereby, it is not necessary to provide a dedicated terminal for testing of the CI value in the package and the package can be downsized. Further, according to the oscillator, a dedicated measuring instrument measuring the current flowing in the electrode of the resonator is not necessary for testing of the CI value of the resonator, and thereby, testing man-hours and testing costs may be reduced.

In the aspect of the oscillator, the circuit device may have a second terminal, and a second interface circuit outputting a second voltage based on the first voltage from the second terminal, and the package may have a third external terminal electrically coupled to the second terminal.

According to the oscillator, the external device may determine validity of the value of the digital signal output from the first external terminal based on the second voltage output from the second external terminal.

In the aspect of the oscillator, in the first mode, output of the oscillation signal from the second external terminal may be controlled based on a signal input to the third external terminal, and, in the second mode, the second voltage may be output from the third external terminal.

In the oscillator, as an external terminal from which the second voltage based on the first voltage is output in the second mode, the third external terminal to which the signal for controlling the output of the oscillation signal from the second external terminal in the first mode is input is also used. Therefore, according to the oscillator, it is not necessary to provide a dedicated terminal from which the second voltage is output in the package and the package can be downsized.

In the aspect of the oscillator, the first terminal and the second terminal may be same terminals, and the first external terminal and the third external terminal may be same external terminals.

What is claimed is:

1. A circuit device comprising:
   a first terminal;
   a first oscillation circuit oscillating a resonator and generating a first voltage for automatic gain control for controlling amplitude of a signal output from the resonator;
   a digital signal generation circuit generating a digital signal corresponding to the first voltage; and
   a first interface circuit outputting the digital signal to the first terminal,
   wherein
   the digital signal generation circuit includes:
   a second oscillation circuit having an oscillation frequency changing according to the first voltage; and
   a counter performing count operation based on an output signal of the second oscillation circuit.

2. The circuit device according to claim 1, further comprising:
   a temperature sensor outputting a signal having a frequency changing according to a temperature; and
   a temperature compensated circuit generating a temperature-compensated signal for controlling an oscillation frequency of the first oscillation circuit and outputting the temperature-compensated signal to the first oscillation circuit, wherein
   in a first mode, the counter performs count operation based on the output signal of the temperature sensor and the temperature compensated circuit generates the temperature-compensated signal according to a count value of the counter, and
   in a second mode, the counter performs count operation based on the output signal of the second oscillation circuit.

3. The circuit device according to claim 1, wherein the second oscillation circuit is a ring oscillator.

4. An oscillator comprising:
   the circuit device according to claim 1; and
   the resonator electrically coupled to the circuit device.

5. A circuit device comprising:
   a first terminal;
   a first oscillation circuit oscillating a resonator and generating a first voltage for automatic gain control for controlling amplitude of a signal output from the resonator;
   a digital signal generation circuit generating a digital signal corresponding to the first voltage; and
   a first interface circuit outputting the digital signal to the first terminal,
   wherein
   the digital signal generation circuit includes:
   an impedance conversion circuit to which the first voltage is input;
   a filter circuit smoothing an output voltage of the impedance conversion circuit; and
   a voltage buffer circuit buffering an output voltage of the filter circuit.

6. The circuit device according to claim 5, wherein the impedance conversion circuit includes:
   a P-channel type MOS transistor having a gate to which the first voltage is input; and
   a divider circuit dividing a voltage of a drain of the MOS transistor.

7. An oscillator comprising:
   the circuit device according to claim 5; and
   the resonator electrically coupled to the circuit device.

8. A circuit device comprising:
a first terminal;
a first oscillation circuit oscillating a resonator and generating a first voltage for automatic gain control for controlling amplitude of a signal output from the resonator;
a digital signal generation circuit generating a digital signal corresponding to the first voltage;
a first interface circuit outputting the digital signal to the first terminal;
a second terminal; and
a second interface circuit outputting a second voltage based on the first voltage from the second terminal.

9. An oscillator comprising:
the circuit device according to claim 8; and
the resonator electrically coupled to the circuit device.

* * * * *